(12) United States Patent
Talwar et al.

(10) Patent No.: US 6,628,215 B2
(45) Date of Patent: Sep. 30, 2003

(54) METHOD AND APPARATUS FOR BINARY ENCODING LOGIC CIRCUITS

(75) Inventors: Sunil Talwar, Warwickshire (GB); Peter Meulemans, Coventry (GB)

(73) Assignee: Automatic Parallel Design Limited (GB)

( * ) Notice: Subject to any disclaimer, the term of this patent is extended or adjusted under 35 U.S.C. 154(b) by 0 days.

(21) Appl. No.: 09/771,922

(22) Filed: Jan. 29, 2001

(65) Prior Publication Data

US 2001/0044708 A1 Nov. 22, 2001

(30) Foreign Application Priority Data

Jan. 27, 2000 (GB) ................................. 0001916

(51) Int. Cl.$^7$ ............................. H03M 5/00; H03M 7/00
(52) U.S. Cl. ............................. 341/107; 341/58; 341/59
(58) Field of Search ............................. 341/58, 59, 50, 341/107, 51, 67, 94

(56) References Cited

U.S. PATENT DOCUMENTS

| | | | | |
|---|---|---|---|---|
| 4,463,344 A | * | 7/1984 | Adler et al. | 341/59 |
| 5,363,099 A | * | 11/1994 | Allen | 341/107 |
| 5,475,388 A | * | 12/1995 | Gormish et al. | 341/107 |
| 5,515,292 A | * | 5/1996 | Roy et al. | 716/2 |
| 5,712,792 A | | 1/1998 | Yamashita et al. | 364/489 |
| 6,173,414 B1 | * | 1/2001 | Zumkher et al. | 714/6 |
| 6,216,260 B1 | * | 4/2001 | Neyfakh | 716/18 |

OTHER PUBLICATIONS

De Micheli, G., et al., "Optimal State Assignment for Finite State Machines", *IEEE Transactions on Computer–Aided Design*, CAD–4 (3), pp. 269–285 (Jul. 1985).
Monteiro, J., et al., "Bitwise Encoding of Finite State Machines", *Proceedings of the 7th International Conference on VLSI Design*, pp. 379–382 (Jan. 1994).
Villa, T., et al., "Nova: State Assignment of Finite Stae Machines for Optimal Two–Level Logic Implementation", *IEEE Transactions on Computer–Aided Design*, vol. 9, No. 9, 905–924 (Sep. 1990).
Coudert, Olivier., "A New Paradigm for Dichotomy–based Constrained Encoding", *Proceedings. Design, Automation and Test in Europe (CAT. NO. 98EX123), Paris France*, (Feb. 23–26, 1998), 830–834.
Mitra, Subhasish., et al. ,"An Output Encoding Problem and a Solution Technique", *IEEE Transactions on a Computer–Aided Design of Integrated Circuits and Systems*, vol. 18, No. 6, (Jun., 1999),761–768.

* cited by examiner

*Primary Examiner*—Peguy JeanPierre
(74) *Attorney, Agent, or Firm*—Schwegman, Lundberg, Woessner & Kluth, P.A.

(57) ABSTRACT

A method and apparatus for state assignment of a logic circuit comprises receiving internal state representations for the logic circuit, determining binary code for the internal state representations by successively dividing the states into disjoint sets of ever decreasing size Each disjoint set of a pair is assigned a one bit at each division step. The division can continue for all bits to be encoded, or the division can be halted and exact encoding used for the encoding of the final number of bits.

125 Claims, 19 Drawing Sheets

METHOD AND APPARATUS FOR BINARY ENCODING LOGIC CIRCUITS

The present invention generally relates to the design automation of electronic logic circuits e.g. combinational circuits, finite state machines, and cascaded circuits. More particularly, the present invention relates to the synthesis of logic from symbolic high level languages.

It is known that in high level descriptions of logic circuits the ability to represent the values of some signals at a higher level of abstraction (i.e. with mnemonics) is greatly desirable. However, to construct a physical circuit the mnemonics must be assigned unique binary codes. It is known that the choice of binary codes has a dramatic effect on the speed, silicon area, and power consumption of the final implemented circuit.

Table 1 below gives an example of the binary encoding of 7 mnemonics of a logic circuit.

TABLE 1

| Mnemonic | Code |
|---|---|
| 1 | 000 |
| 2 | 001 |
| 3 | 011 |
| 4 | 111 |
| 5 | 101 |
| 6 | 100 |
| 7 | 110 |

The minimum number of bits necessary to encode the mnemonics is p, where p is the smallest power of 2 such that $2^p$ is greater than or equal to the number of mnemonics. Clearly in the example given in Table 1, 3 bit encoding is capable of coding for up to 8 mnemonics.

The above formula for p gives the minimal number of bits necessary for the encoding of the states of a logic circuit given by mnemonics. Thus, for 5 to 8 mnemonics at least 3 bits are needed, for 9 to 16 mnemonics at least 4 bits are needed, for 17 to 32 mnemonics at least 5 bits are needed, etc.

In the example given in Table 1, a unique binary encoding is given to each mnemonic. However, the choice of the binary encoding to be given to each mnemonic affects the speed area and power consumption of the implemented circuit. Thus, the task of choosing the binary codes is a key step in the implementation of circuits. Unfortunately, this task is very complex. Table 2 below shows the number of distinct minimal length encodings for circuits with various numbers of mnemonics.

TABLE 2

| Number of Mnemonics | Distinct Encodings |
|---|---|
| 2 | 1 |
| 3 | 3 |
| 4 | 3 |
| 5 | 140 |
| 6 | 420 |
| 7 | 840 |
| 8 | 840 |
| 9 | 10,810,800 |
| . | . |
| . | . |
| . | . |
| 16 | >>5.5 × $10^{10}$ |

As Table 2 shows, for circuits with nine mnemonics there are at least 10,810,800 distinct minimal length encodings. An exhaustive evaluation of each encoding is thus not feasible. The solution to the problem of the assignment of encodings to the mnemonics of the circuits have been the target of a great deal of work in the prior art. However, the problem of the prior art methods is that they are wholly heuristic and yield slow, area hungry and power hungry circuits.

In one prior art method disclosed in a paper by G De Micheli et al entitled "Optimal State Assignment of Finite State Machines" (IEEE Transactions on Computer Aided Design, Vol. CAD-4, No. 3, July 1985, pages 269–285), a heuristic technique is used in which states which have the same next state and output for a given input are noted. These states are to be given adjacent assignments. Another heuristic is then used to define the complete code of each of the states so as to satisfy as many of the adjacency conditions as possible. This technique attempts to minimise the literal count. This technique is however limited since although it is known that the literal count is related to the area of the final circuit implementation in certain technologies, in other technologies such as field programmable gate arrays, literal count bears a weak relationship to the quality of the final implementation.

In another prior art method disclosed in a paper by T Villa and A Sangiovanni-Vincentelli entitled "NOVA: State Assignment of Finite State Machine for Optimal Two-level Logic Implementations" (26th Design Automation Conference pp 327–332) a heuristic technique is used in which states which have the same next state and output for a given input are noted. These states are to be given adjacent assignments. An exact method is then used to satisfy all the adjacency conditions without necessarily using minimal length encoding. It is shown in the paper by experimental methods that this technique rarely yields a lower literal count than minimal length encoding. Moreover, better experiment results from those of the above method (G De Michele) are reported.

In another prior art method disclosed in a paper by J. Monterio et al entitled "Bitwise Encoding of Finite State Machines" (7th International Conference on VLSI Design, pages 379–382, January 1994), the states of a finite state machine are encoded iteratively to define the code word based on a heuristic. In this technique all bits are encoded sequentially in an attempt to once again minimise the number of literals. A limitation of this technique is that only the state transitions i.e. the next states are taken in consideration in the heuristic and no outputs of the finite state machine are taken into consideration.

FIG. 1 is a schematic diagram of a finite state machine which receives primary inputs and outputs primary outputs. The major component of the finite state machine is the combinational logic circuit 1 which acts on the primary inputs and present state variables (feedback inputs) to generate the primary outputs and next state variables (feedback outputs). The combinational logic circuit can be described by internal state representations i.e. mnemonics. In a finite state machine the next state of the machine is dependent on the inputs and the present state of the machine. Thus, the states of the finite state machines are output as feedback outputs and are stored in a state memory 2 which comprises flip-flops 2a, 2b and 2c: one per bit for representing the internal states of the finite state machine. FIG. 1 is represented as having internal states represented by 3 bit encodings with 3 bit encoded primary inputs and 3 bit encoded primary outputs.

Thus the inventors of the present invention have identified that in the approach of Monterio et al the omission of the consideration of the primary outputs and previously determined encoding bits in the heuristic reduces the effectiveness of the technique.

The approach by Monterio et al is also restricted to minimal length encoding and this does not always result in the best circuit from the viewpoint of area and/or speed.

Further, this approach uses a technique for the state assignment of finite state machines in which the finite state machine is decomposed by partitioning. This technique suffers from the disadvantage of the need to find preserved partitions in the set of mnemonic states. Such partitions are not always present.

It is thus an object of the present invention to provide a circuit design method and apparatus in which the disadvantages of the prior art methods are overcome and circuits of desired speeds, silicon area, and power consumption can be produced.

In accordance with a first aspect of the present invention, there is provided a method and apparatus for determining the binary encodings of a circuit which is in part heuristic and in part exact.

In this aspect of the present invention the inventors have realised that the assignment of binary encodings to a circuit can benefit from the use of the exact technique when the number of bits to be encoded is reduced. The number of bits to be encoded can be reduced by initially using a heuristic technique to determine the encodings of a number of bits thereby leaving only a limited number of bits left to be encoded. The exact technique can be used for the encoding of the last few bits to be determined.

The exact evaluation can be carried out using information on the preferred logic implementation e.g. Application Specific Integrated Circuits (ASIC's) or Field Programmable Gate Arrays (PPGA's). Thus this allows the preferred implementation to be taken into account during the state assignment.

In this aspect of the present invention, any conventional heuristic technique can be used for the encoding of the initial bits.

In this aspect of the present invention, the search can be successively divided into blocks by the encoding of initial bits using the heuristic technique. Each block is exhaustively evaluated in a determined sequence.

Either the literal count can be evaluated, or the evaluation can be made on any conventional synthesis tool relative to any conventional vendors library. As each block is evaluated, it is combined with the next block in the sequence and the mnemonics of this block are encoded relative to the encodings already obtained for the preceding block. In this way, the complete circuit is encoded in an incremental manner block-by-block so that the resulting circuit has the sane functionality as the original circuit.

The sequence of blocks to be evaluated is, in an embodiment, determined by identifying the block for which the number of next states not in the present states of the block is a minimum. For any next states which are not in the present states of the block, default encodings are used for these states thus allowing the evaluation of a virtual machine for which a small number of present states transit to unencoded next states within the set.

When the block has been encoded, it is combined with the logically adjacent blocks as defined by the partial encodings to determine a larger block which has the minimum number of unencoded next states not in the present states set for the large block. This large block then evaluated by setting any next states not in the set to the default value as before. In this way the encodings for the blocks are incrementally determined relative to the encodings already obtained for previous blocks.

An alternative way to determine the sequence of blocks is simply to order them according to the order of the gray code of the partial encoding.

In a second aspect of the present invention, the symbolic state representations for a circuit are encoded one bit at a time by repeatedly dividing the symbolic state representations into disjoint sets and assigning a one bit code to each of the states of the disjoint sets in dependence upon the divisions. The disjoint sets become smaller after each division and the divisions are determined in dependence upon the encoding of previous divisions.

Thus, in the repeated one bit encoding, a one bit code is assigned to each of the two disjoint sets generated by the division of either the state set or a previously generated disjoint set. The one bit code depends upon the manner in which the two disjoint sets were determined. At each repetition the combination of the thus far determined n divisions leads to at most $2^n$ encoded disjoint sets, each set having associated with it a unique n-bit binary code.

The divisions are determined by identifying the set of next states transited to from a set of present states in response to some combination of the primary and feedback inputs. This set and its compliment define a division. This division is encoded with a one bit binary code. In a preferred embodiment the identified set is encoded with 1 and its compliment with 0. The encoded disjoint sets are subsequently themselves divided as more divisions are calculated. The divisions can be made sequentially for the necessary number of bits to binary encode the symbolic state representation. Alternatively, the division of the disjoint sets can stop when the set size reaches a predetermined set size at which the encoding of the states in the disjoint sets can be determined exactly as described hereinabove with regard to the previous aspect of the present invention.

The divisions do not necessarily comprise preserved partitions since they need not preserve cover in the set of next states. The set of next states for a set of present states can include other states not in the present state set. When assigning binary codes to the sets resulting from the division, in order to evaluate a block of the logic circuit resulting from the division of the circuit a default value can be used for these next states lying outside the present state set.

The repeated determination of divisions results in the repeated division of the logic circuit into blocks using the next state table. When there are a number of candidate divisions, a division can be chosen to save logic i.e. to reduce the number of literals.

At each stage of the division of the symbolic states into disjoint sets, there can be a number of possible divisions. In order to avoid having to proceed with encoding a larger number of possible divisions, in accordance with an embodiment of the present invention, for each encoded bit i.e. for each division, a cost of outputs of the circuit is determined and this is used in the determination of the optimum binary code for the encoded bit. The cost preferably comprises the cost of the primary outputs and any previously encoded bits. The cost can comprise the number of literals for the outputs and any previously encoded bits which form feedback outputs, and the optimum binary code is determined to minimise the number of literals. Thus in accordance with this embodiment, divisions can be chosen to take into account the number of literals. This can aid a search for the optimum encoding.

The identification of a set of next states which is a subset of all states is preferably achieved for a plurality of logically adjacent possible inputs. It is known that larger blocks of logically adjacent is result in a saving of logic.

This aspect of the present invention is applicable to both minimal length encoding and non minimal length encoding. For minimal length encoding, the number of bits used to binary encode the symbolic representations is a minimum. A non minimal length encoding, any number of bits can be used for encoding the symbolic representations. Whilst minimal length encoding will result in a minimum number of flip-flops, it may not result in the optimum circuit from the viewpoint of speed, area, or power consumption. For example, in field programmable gate array (FPGA's), each logical component has built into it a flip-flop and whether this flip-flop is used or not does not affect the overall area of the circuit. For many implementations, non-minimal length encoding, whilst requiring more flip-flops, can result in a higher speed circuit. Thus, for non minimal length encoding, any subsequent division, when combined with all previous divisions, need only result in encoded disjoint sets in which at least one of the sets is smaller than before. For minimal length encoding, the number of next states in the disjoint sets must be up to half the number of present states rounded up to the nearest power of 2 and the compliment set must also contain up to half the number of present states rounded up to the nearest power of 2.

For minimal length encoding, where disjoint sets of the required size cannot be identified for an input, i.e. the sets are too small, sets of states for a plurality of different inputs can be unioned to form disjoint sets of the required size. Such disjoint sets do not in general result in the same logic saving since the plurality of inputs require a respective plurality of terms to define them. Logical adjacency is however provided for the unioned sets since they are assigned the same code for a binary bit (i.e. a feedback output).

In accordance with a third aspects the present invention provides a method and apparatus for optimising state assignments for a circuit. A full binary encoding of a circuit can be optimised using this technique. A plurality of the binary encoded bits are encoded at a least one symbolic representation. Thus, for a 32 bit binary encoded representation, any number of bits can be encoded symbolically and any number of symbolic representations can be provided for segments of the code. For example the first and last 16 bits can be encoded separately as segment x and segment y, the last 16 bits only can be encoded as segment y, or the first 8, next 8 and last 16 bits can be encoded as segment x, segment y, segment z.

Each of the symbolic representations resulting from this symbolic encoding can then be evaluated to determine the optimum binary codes for this symbolic representation having regard to any binary codes already provided.

The determination of the optimum binary codes can be achieved using any conventional technique including the techniques of the previously described aspects of the present invention.

This aspect of the present invention enables the tuning of the encoding already provided to obtain a more optimum binary encoding. Any number of the bits can be selected for optimisation and this can be repeated any number of times on various combinations of bits in order to try to optimise the encoding.

This aspect of the present invention is applicable to any type of logic circuit not just sequential logic circuits e.g. finite state machines. When the technique is applied to logic circuits for which the next state depends on the present state the technique of the previous aspects can be employed for the encoding.

Embodiments of the present invention will now be described with reference to the accompanying drawings, in which.

Figure 14A:
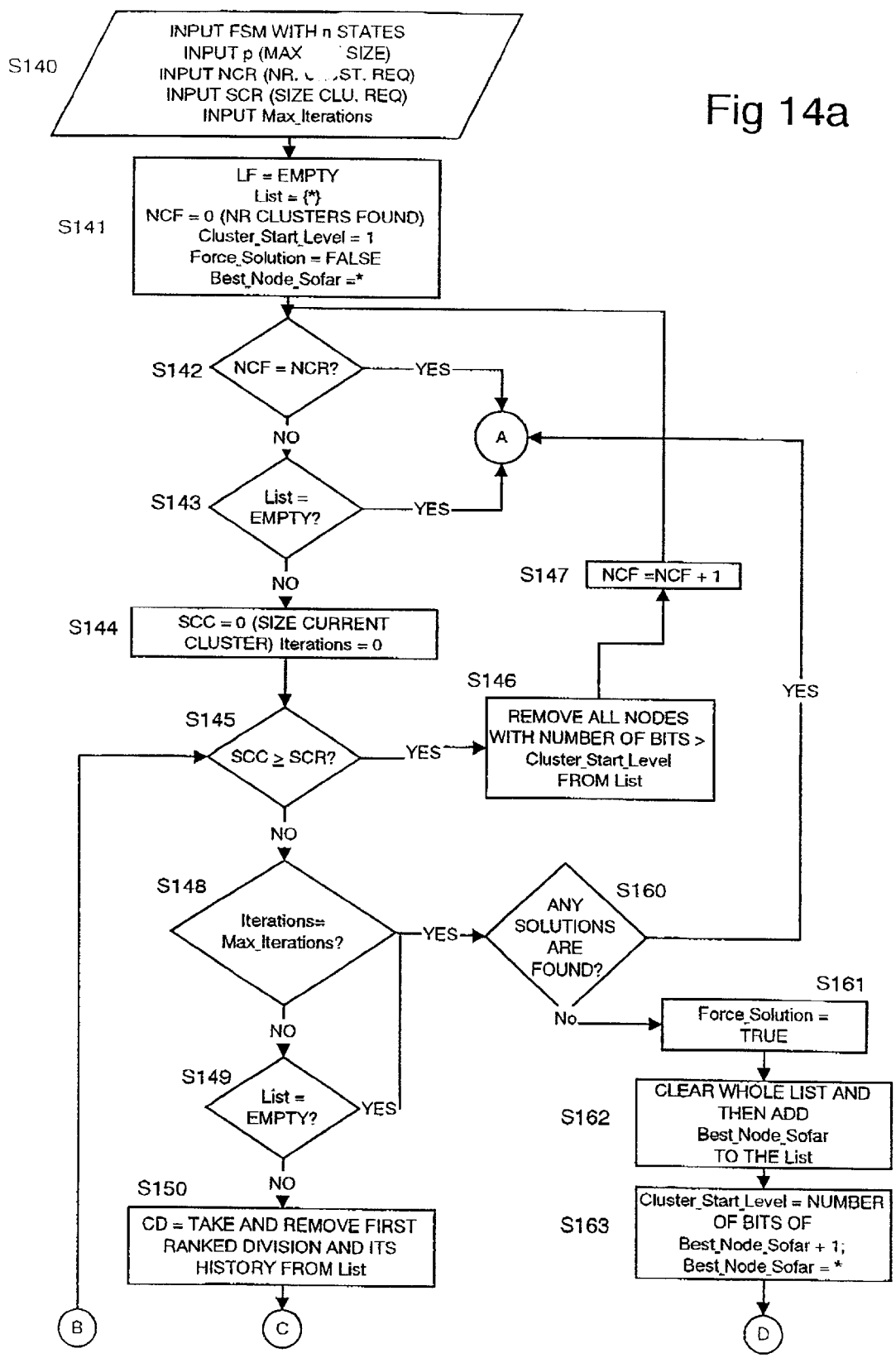
Figure 14B:
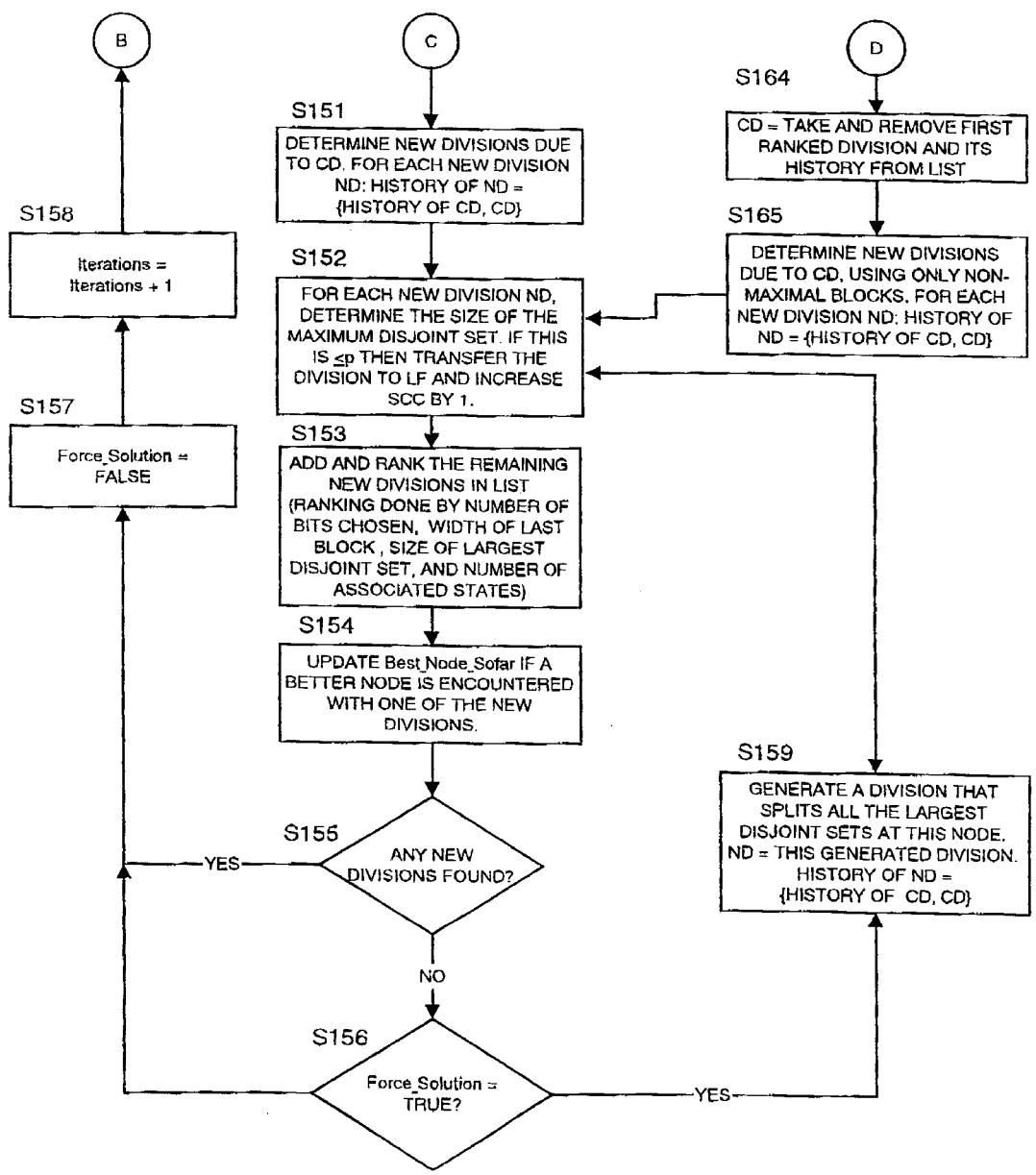
Figure 15:
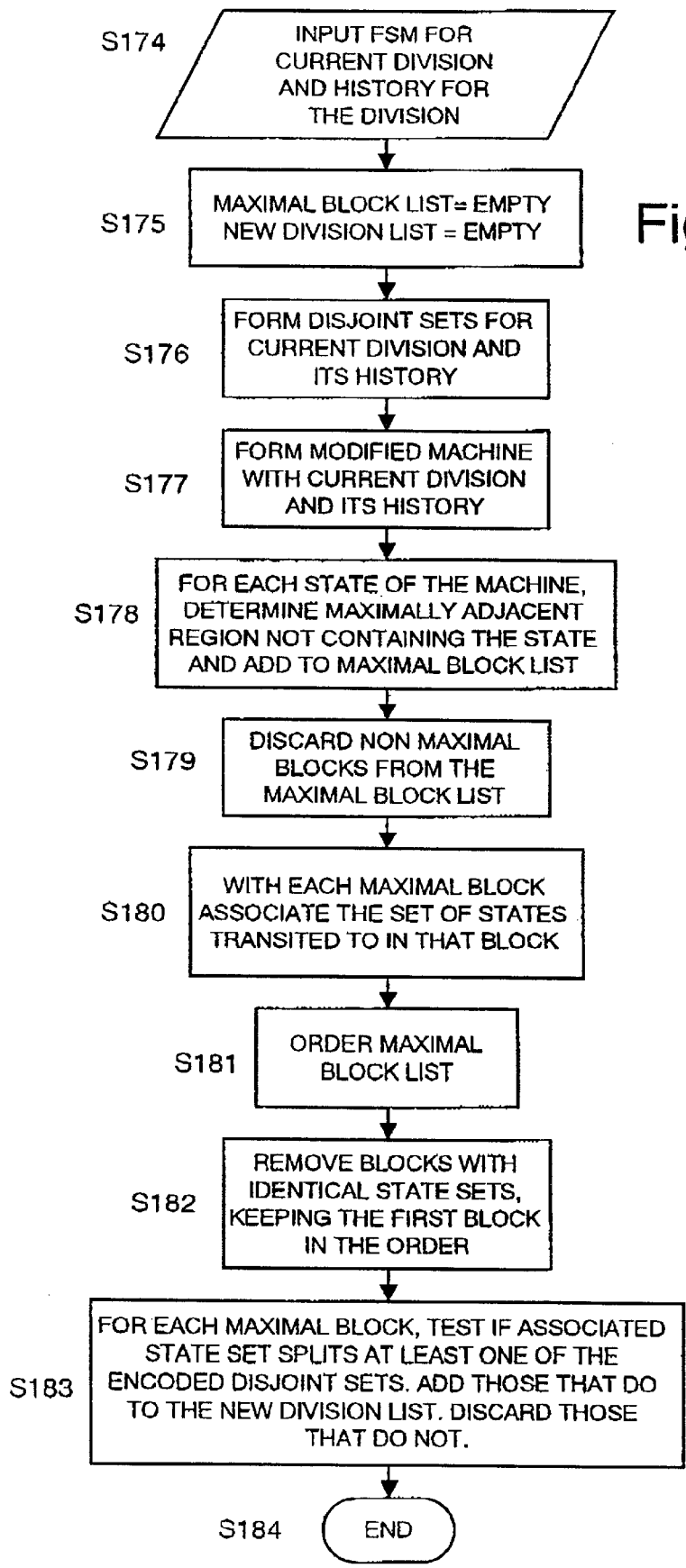
Figure 16:
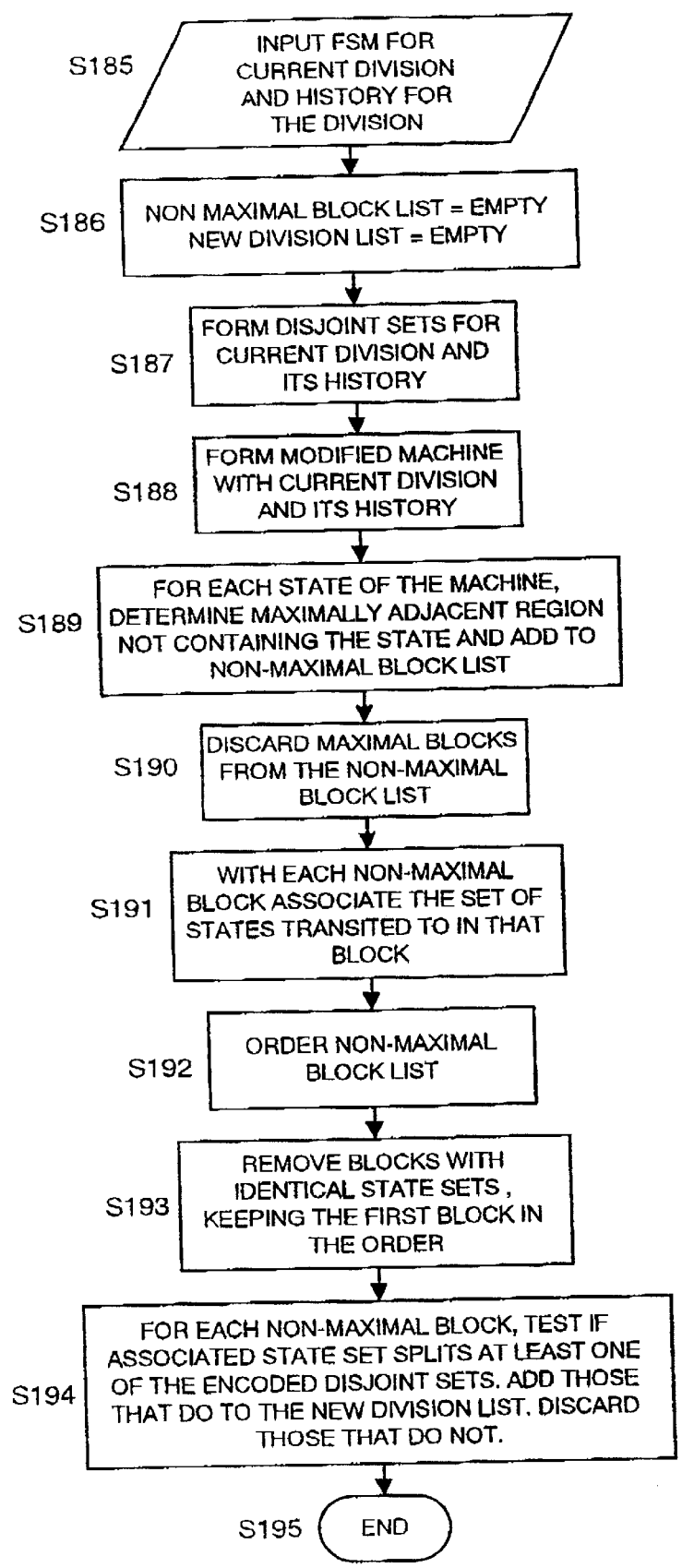
Figure 17:
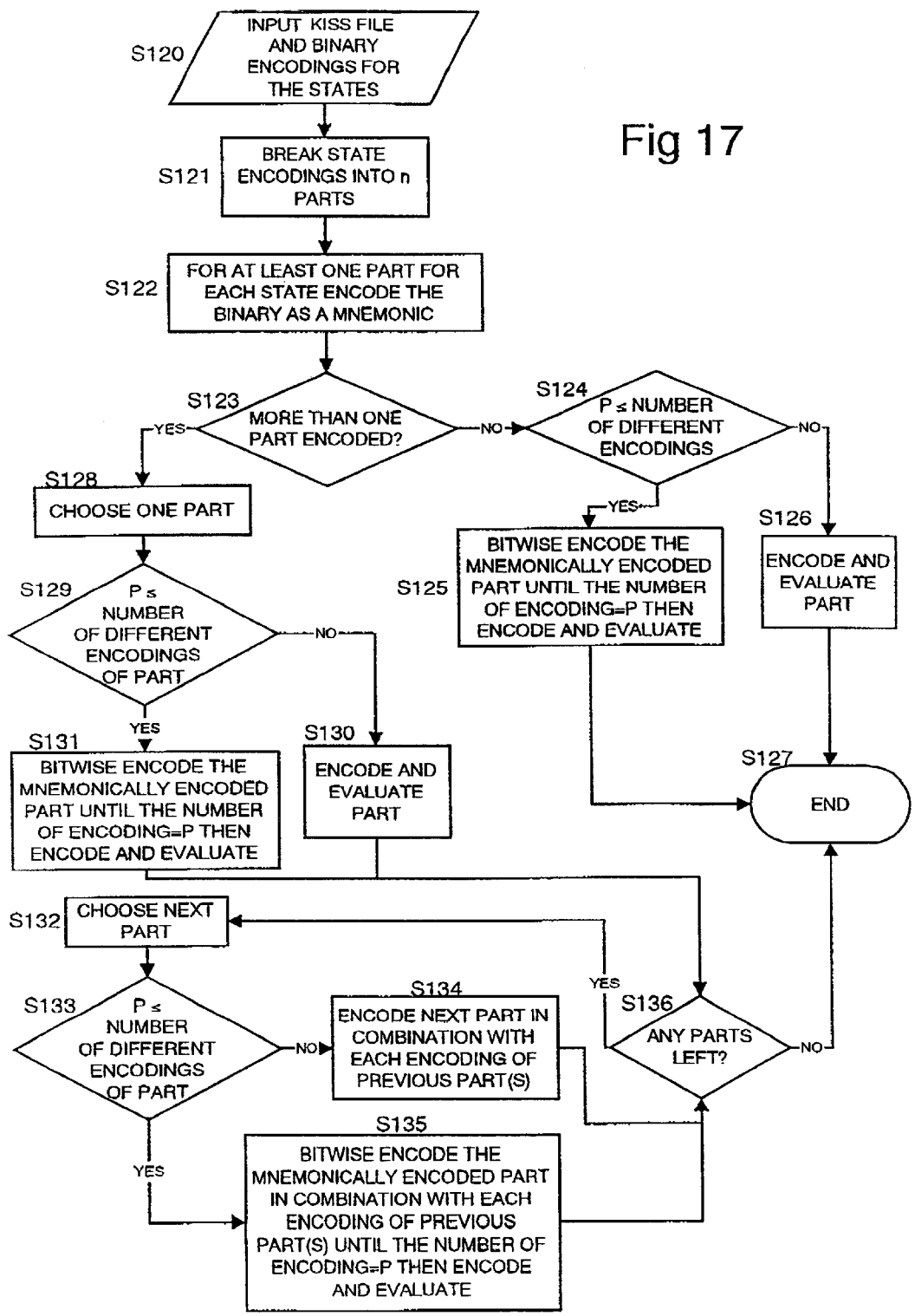

FIGS. 14a, b and c are flow diagrams illustrating a hybrid depth/breadth first technique for non-minimal length encoding in a preferred fifth embodiment;

FIG. 15 is a flow diagram illustrating the step S151 of determining divisions using maximal blocks in FIG. 14b in more detail;

FIG. 16 is a flow diagram illustrating the step S165 of determining divisions using non maximal blocks in FIG. 14b in more detail; and FIG. 17 is a flow diagram illustrating a sixth embodiment of the present invention.

The first embodiment of the present invention will now be described in detail with reference to FIGS. 2 to 10.

This embodiment of the present invention implements minimal length encoding for symbolic (mnemonic) state representation.

In this embodiment of the present invention the symbolic representations comprise states 1 to 7 of a sequential circuit (finite state machine—FSH).

Conventionally, the state transition data for finite state machines can be given as a "KISS" table. The KISS table used in this embodiment of the present invention is illustrated in the form of a state transition table in Table 3 below.

TABLE 3

| Present | Inputs | | | | | | | |
|---|---|---|---|---|---|---|---|---|
| States | 000 | 001 | 011 | 010 | 110 | 111 | 101 | 100 |
| 1 | 3/ | 5/ | 3/ | 6/ | 4/ | 3/ | 5/ | 4/ |
|   | 000 | 000 | 010 | 010 | 010 | 010 | 010 | 000 |
| 2 | 1/ | 1/ | 2/ | 2/ | 5/ | 3/ | 1/ | 2/ |
|   | 010 | 001 | 001 | 000 | 001 | 001 | 000 | 010 |
| 3 | 3/ | 5/ | 3/ | 6/ | 4/ | 3/ | 5/ | 4/ |
|   | 100 | 100 | 010 | 010 | 010 | 010 | 010 | 100 |
| 4 | 3/ | 5/ | 3/ | 7/ | 5/ | 3/ | 5/ | 4/ |
|   | 000 | 000 | 101 | 100 | 001 | 001 | 101 | 000 |
| 5 | 1/ | 1/ | 2/ | 2/ | 1/ | 1/ | 2/ | 2/ |
|   | 010 | 001 | 001 | 101 | 101 | 100 | 100 | 010 |
| 6 | 1/ | 5/ | 3/ | 2/ | 1/ | 1/ | 2/ | 2/ |

TABLE 3-continued

| Present | Inputs | | | | | | | |
|---|---|---|---|---|---|---|---|---|
| States | 000 | 001 | 011 | 010 | 110 | 111 | 101 | 100 |
| 7 | 010 3/ 100 | 101 5/ 100 | 101 3/ 101 | 101 2/ 101 | 101 1/ 101 | 100 1/ 100 | 100 2/ 100 | 010 4/ 100 |

The KISS table gives the next states in symbolic form and primary outputs in binary for present states in symbolic form and primary inputs in binary.

The circuit can be considered as 6 interconnected logic functions: 3 for the primary outputs and 3 for the next states. Tables 4, 5 and 6 below illustrate the 3 logic functions for the three primary outputs.

TABLE 4

| Present | Inputs | | | | | | | |
|---|---|---|---|---|---|---|---|---|
| States | 000 | 001 | 011 | 010 | 110 | 111 | 101 | 100 |
| 1 | 0 | 0 | 0 | 0 | 0 | 0 | 0 | 0 |
| 2 | 0 | 0 | 0 | 0 | 0 | 0 | 0 | 0 |
| 3 | 1 | 1 | 0 | 0 | 0 | 0 | 0 | 1 |
| 4 | 0 | 0 | 1 | 1 | 0 | 0 | 1 | 0 |
| 5 | 0 | 0 | 0 | 1 | 1 | 1 | 1 | 0 |
| 6 | 0 | 1 | 1 | 1 | 1 | 1 | 1 | 0 |
| 7 | 1 | 1 | 1 | 1 | 1 | 1 | 1 | 1 |

Table 4 illustrates the primary output bit 1 for present states and primary inputs.

TABLE 5

| Present | Inputs | | | | | | | |
|---|---|---|---|---|---|---|---|---|
| States | 000 | 001 | 011 | 010 | 110 | 111 | 101 | 100 |
| 1 | 0 | 0 | 1 | 1 | 1 | 1 | 1 | 0 |
| 2 | 1 | 0 | 0 | 0 | 0 | 0 | 0 | 1 |
| 3 | 0 | 0 | 1 | 1 | 1 | 1 | 1 | 0 |
| 4 | 0 | 0 | 0 | 0 | 0 | 0 | 0 | 0 |
| 5 | 1 | 0 | 0 | 0 | 0 | 0 | 0 | 1 |
| 6 | 1 | 0 | 0 | 0 | 0 | 0 | 0 | 1 |
| 7 | 0 | 0 | 0 | 0 | 0 | 0 | 0 | 0 |

Table 5 illustrates the primary output bit 2 for present states and primary inputs.

TABLE 6

| Present | Inputs | | | | | | | |
|---|---|---|---|---|---|---|---|---|
| States | 000 | 001 | 011 | 010 | 110 | 111 | 101 | 100 |
| 1 | 0 | 0 | 0 | 0 | 0 | 0 | 0 | 0 |
| 2 | 0 | 1 | 1 | 0 | 1 | 1 | 0 | 0 |
| 3 | 0 | 0 | 0 | 0 | 0 | 0 | 0 | 0 |
| 4 | 0 | 0 | 1 | 0 | 1 | 1 | 1 | 0 |
| 5 | 0 | 1 | 1 | 1 | 1 | 0 | 0 | 0 |
| 6 | 0 | 1 | 1 | 1 | 1 | 0 | 0 | 0 |
| 7 | 0 | 0 | 1 | 1 | 1 | 0 | 0 | 0 |

Table 6 illustrates the primary output bit 3 for present states and primary inputs.

Table 7 below illustrates the logic function for the next states from present states for primary inputs.

TABLE 7

| Present | Inputs | | | | | | | |
|---|---|---|---|---|---|---|---|---|
| States | 000 | 001 | 011 | 010 | 110 | 111 | 101 | 100 |
| 1 | 3 | 5 | 3 | 6 | 4 | 3 | 5 | 4 |
| 2 | 1 | 1 | 2 | 2 | 5 | 3 | 1 | 2 |
| 3 | 3 | 5 | 3 | 6 | 4 | 3 | 5 | 4 |
| 4 | 3 | 5 | 3 | 7 | 5 | 3 | 5 | 4 |
| 5 | 1 | 1 | 2 | 2 | 1 | 1 | 2 | 2 |
| 6 | 1 | 5 | 3 | 2 | 1 | 1 | 2 | 2 |
| 7 | 3 | 5 | 3 | 2 | 1 | 1 | 2 | 4 |

The apparatus for implementing this embodiment of the present invention will now be described with reference to FIGS. 2 and 3.

Figure 1:
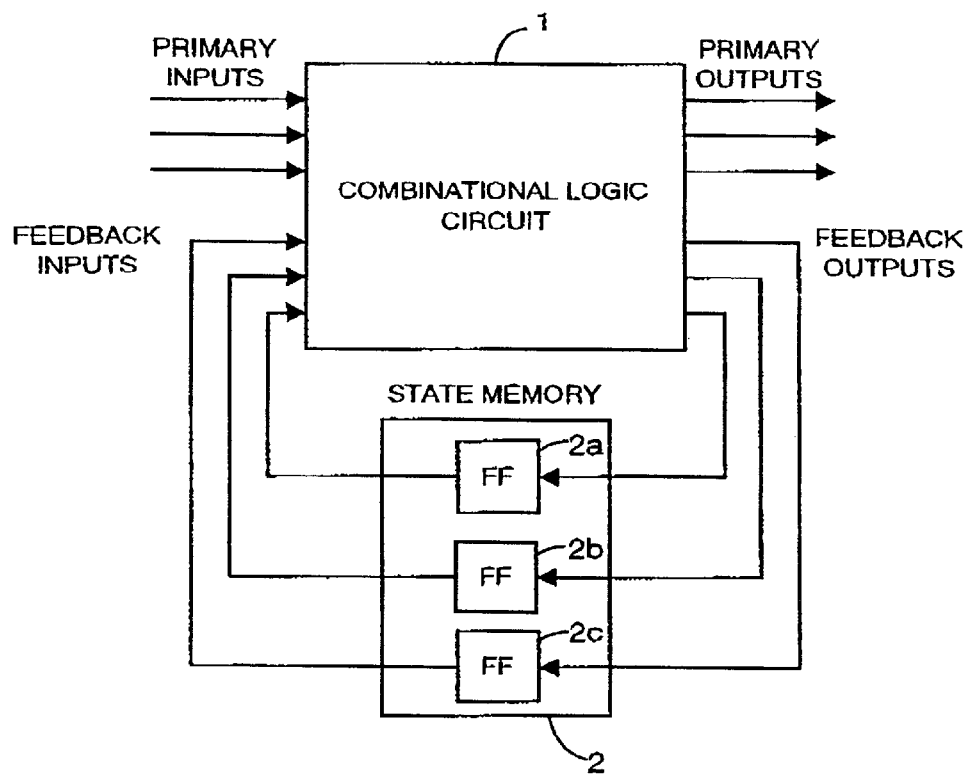
FIG. 1 is a schematic diagram of the finite state machine.
Figure 2:
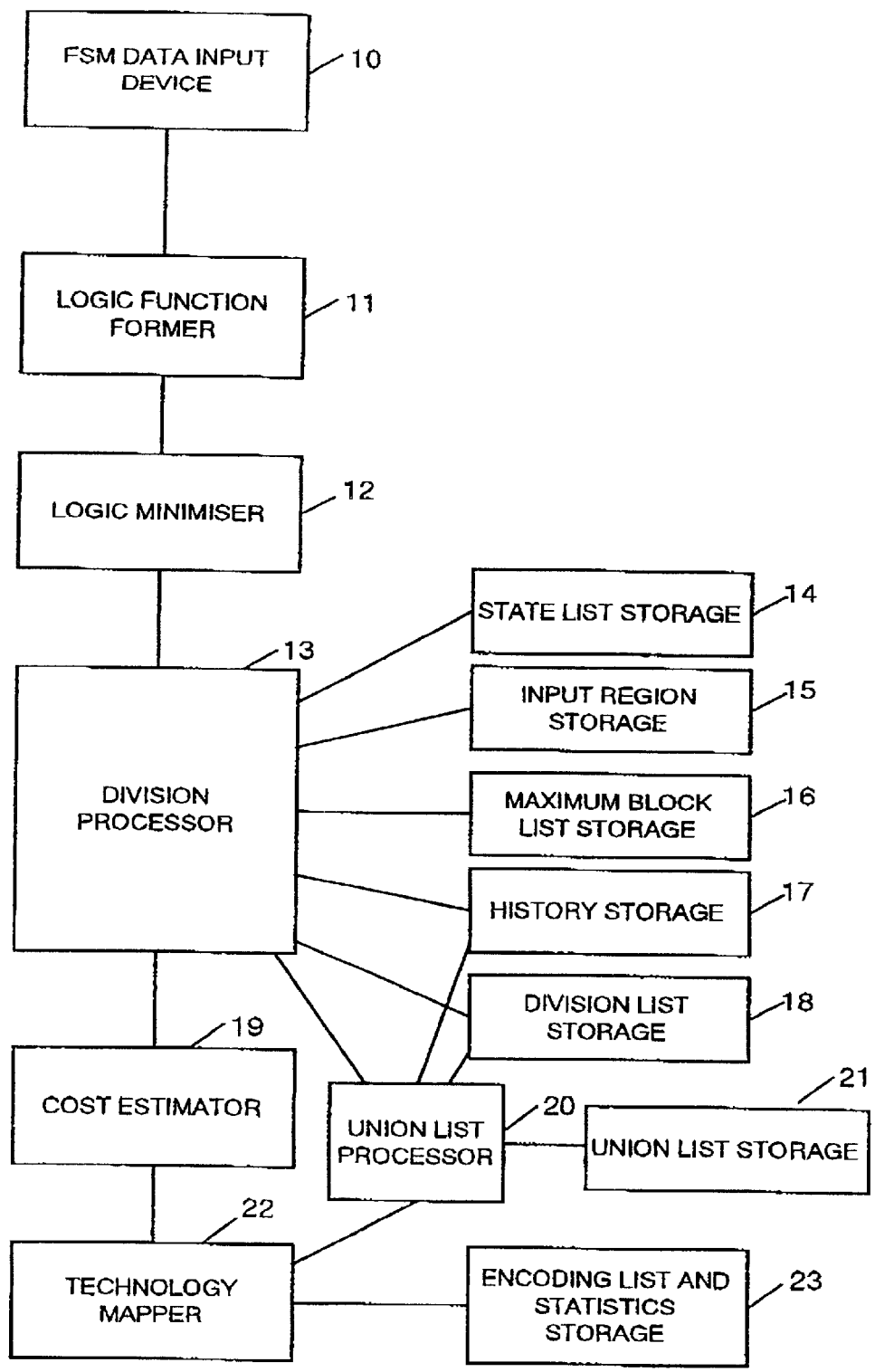
FIG. 2 is a functional diagram of the apparatus in accordance with an embodiment of the present invention.
Figure 3:
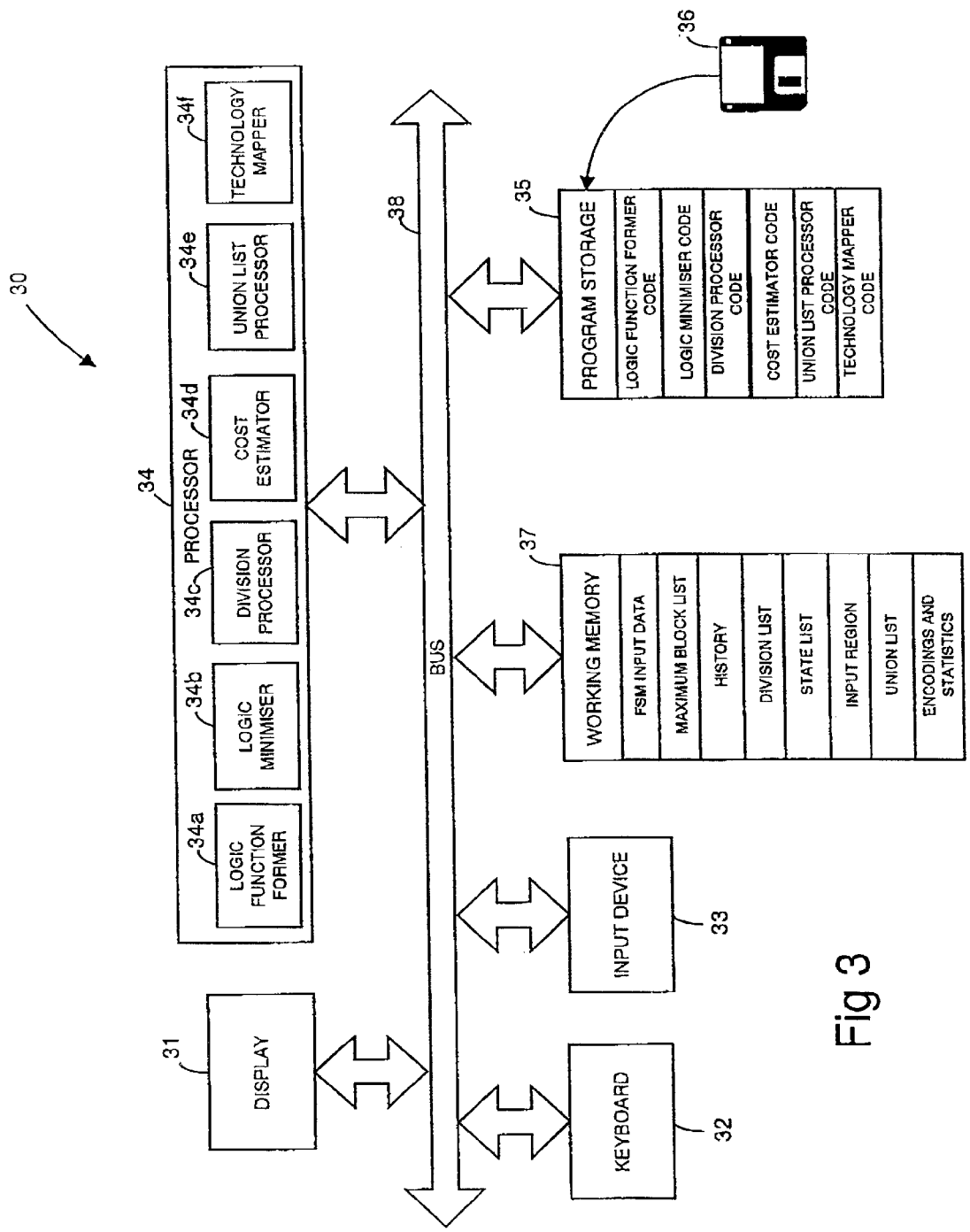
FIG. 3 is a schematic diagram of a computer system for implementing the functional system of FIG. 2.

FIG. 2 is a schematic diagram of the functional components of this embodiment of the present invention.

A finite state machine (FSM) data input device 10 is provided for the input of the state transition data as given in Table 3. A logic function former 11 is provided for generating logic functions as will be described in more detail hereinafter. A logic minimiser 12 is provided to minimise the logic functions. A division processor 13 is provided to determine divisions of the set of states. The division processor 13 operates with reference to a state list stored in the state list storage 14, an input region stored in the input region storage 15, a maximal block list stored in the maximal block list storage 16, a division history stored in the history storage 17, and a division list stored in the division list storage 18.

A union list processor 20 is also provided to union sets which are not of the required size by reference to a union list in the union list storage 21. A cost estimator 29 is provided to estimate a cost of the divisions generated by the divisions processor 13 to enable the divisions to be ranked and to thus enable the optimum divisions to be identified.

A technology mapper 22 is provided for mapping the encodings onto the desired technology in order to evaluate performance and synthesise the circuit. The performance can be determined from statistics which are stored together with the encoding list in the encoding list and statistic storage 23. The technology mapper 22 can be of any conventional type. It receives a finite state machine in a high level language or a KISS type file in binary form and constructs the logic circuit.

A physical embodiment of the present invention will now be described with reference to FIG. 3 which illustrates a computer system 30 for the implementation of the state assignment of the finite state machine.

The computer system 30 is provided with a conventional display 31 for the display of result to an operator. The keyboard 32 is also provided for the input of commands and data. An input device 33 is provided for the input of the finite state machine transition data. The input device 33 can be any form of input device such as a modem or network card for receiving the data from a remote device, a mass storage interface for retrieving the data from a; mass storage device such as a hard disk drive, floppy disk drive or CDROM, or a manual input device e.g. a keyboard. The input finite state machine data is stored in the working memory 37.

The computer system 30 is also provided with a processor 34 which implements computer code stored in a program storage device 35. The processor 34 implements a logic function former 34*a* by loading and running the logic function former code stored in the program storage 35. The processor 34 also implements a logic minimiser 34*b* by loading and running the logic minimiser code stored in the program storage 35. The processor also implements a divisions processor 34c by loading and running the division processor code stored in the program storage 35. The processor 35 further implements a cost estimator 34d by loading and running the cost estimator code stored in the program storage 35. The processor 35 further implements a union list processor 34e by loading and running the union list processor code stored in the program storage 35. The processor 35 also implements a technology mapper 34f by loading and running the technology mapper code stored in the program storage 35.

The program storage device 35 can comprise any device for storing computer code which can be accessed by the processor 34. Conventionally, the program storage comprises a hard disk drive. It can however, comprise any other form of storage device such as programmable read only memory, CDROM, or random access memory. The program storage device 34 can be loaded with the program code from a removable storage device 36 such as a floppy disk.

The working memory 37 contains not only the finite state machine input data received from the input device 33, but also the data used by the modules implemented within the processor 34. Thus the working memory 37 stores temporarily the maximal block list, the division history data, the division list, the state list, the input region and the union list. Further, the working memory 37 will store the encodings and statistics as an output of the technology mapper 34f. The encodings and statistics can then be made available for the selection of an appropriate encoding having regard to the statistics for the manufacture of a logic circuit.

The method of operation of this embodiment of the present invention will now be described with reference to FIGS. 4 to 10.

Before considering the detailed implementation of this embodiment, an overview of the strategy of the technique of this embodiment will now be described with reference to FIG. 4.

Given a state machine with n states, we seek to divide the n states into two disjoint subsets each containing at most half the total number of states (minimal length encoding). The first bit of this state assignment will be set to 1 for states in one of the two sets and 0 for the states in the other set. This process is then repeated to determine the second bit of the state assignment. However, additional restrictions apply to this second division, namely that the two disjoints subsets are divided in half so that each of the resulting four sets are disjoint and contain at most a quarter of the smallest power of two no smaller than the number of states. This process is repeated until the resulting sets contain a predetermined number of states at which point an exact technique is used to evaluate the remaining encodings The predetermined number of states can be 0 in which case the process is repeated until the complete assignment is determined.

Figure 4:
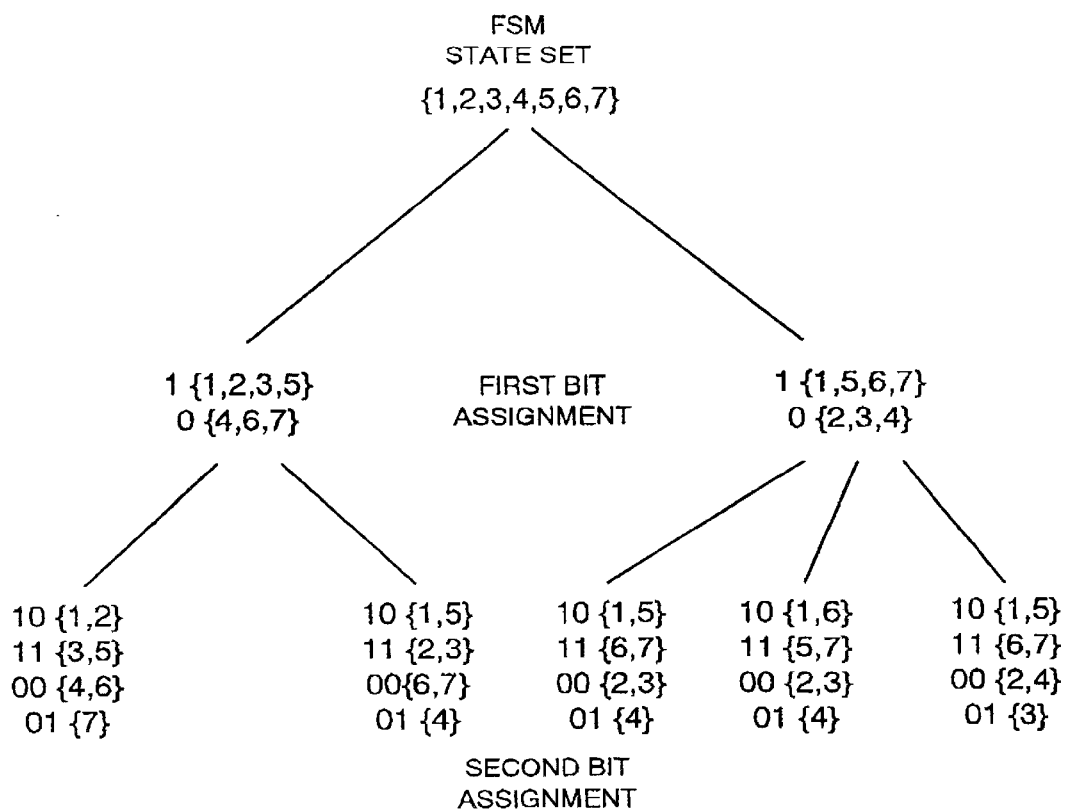
FIG. 4 is a diagram illustrating the process of division to form disjoint sets of states.

FIG. 4 illustrates the division process for this embodiment. The finite state machine state set {1,2,3,4,5,6,7} can be divided as illustrated in FIG. 4 in two different ways. The state set {1,2,3,4,5,6,7} can be divided into the two disjoint sets {1,2,3,5} and {4,6,7} or the two disjoint sets {1,5,6,7} and {2,3,4}. At this division each of the sets is assigned a bit encoding is will be assigned to the set which was identified from the next states as a set of next states of the required size i.e. less than or equal to half the number of present states. In Table 7 above it can be seen that for the input --1 (where -- indicates "don't care") all the present states can only transit to the next state set of {1,2,3,5}. Thus for the logically adjacent input is block --1, any encoding of the next two bits of the states will result in the first bit of all states under inputs --1 (and all present states) to be encoded by 1. This implies that half the table for the first bit can be represented logically as --1---1 where the first three bits are the primary inputs, the next three bits are the feedback inputs and the last bit is the output. This represents a significant logic saving.

The next division which is carried out on the disjoint sets generates once again a number of disjoint sets for each previously determined disjoint set. Each of the disjoint sets will be assigned a second encoded bit in combination with the first encoded bit. Keeping track of previously encoded bits for sets generated by the division process is achieved by the division history.

It can thus be seen from FIG. 4 that a number of possible divisions can result. For a four state machine {1,2,3,4} the only division possible are {{1,2},{3,4}}, {{1,3},{24}}, {{1,4},{2,3}}. The number of possible divisions grows very rapidly with the number of states of the machine. Therefore, it is in general not possible to examine all divisions.

Thus the problem faced is to determine how to divide the state set into suitable parts in some way that does not require complete enumeration. This is achieved in this embodiment by looking for logic savings in the next state table by looking for sets of next states for logically adjacent inputs.

In addition to determining suitable divisions, there is still the problem that a number of suitable divisions can be determined. Thus in order to estimate how efficient complete state assignment will be if the division is chosen, the suitability of each candidate division needs to be evaluated. In this embodiment of the present invention this evaluation of each division i.e. suitability of the encoding, is achieved by evaluating a cost of the outputs of the machine taking into account the previously selected encodings. This will be described in more detail hereinafter.

The principles behind the division of the state set will now be considered in more detail.

Given a state machine with n states, let $m=[\log_2 n]$ be the smallest power of 2 greater than or equal to n. It is sought to divide the n states into two disjoint subsets each containing at most $2^m/2$ states. The encoding for the bit of the state assignment will be set to 1 for the states in the one of the two sets and 0 for the states in the other set.

A limited number of divisions are therefore derived from the next state table which are likely to lead to large savings in the implementation of the circuit. It is known in the theory of logic minimisation that larger logical groupings (powers of 2 of 1's) always lead to larger savings in the implementation of the circuit.

For the finite state machine of this embodiment of the present invention, the inputs and outputs are already given in binary form and the states are mnemonics (see Table 3 above). Thus all adjacency relationships between the inputs are known. The only adjacency relationship known about states is that the set of all states form an adjacent block for any state assignment. This fact can be harnessed to ensure savings in the feedback outputs by identifying columns in the next state table. Once an encoding for a bit for a state has been defined some further adjacency information about the states has become available (because of their feedback output encoding). It now becomes known that all states in the set indexed by 1 satisfy an adjacency relationship as to the ones in the set indexed by 0. After the first bit encoding has been chosen, this relationship is exploited as well as the one due to columns. In general, as more bit encodings are chosen, more information becomes available and this is iteratively exploited. the first proposed way of grouping is to consider whole columns in the next state table. Suppose that a column contains at most $2^m/2$ states, then if 1 is assigned as a first bit encoding for all states appearing in the column, a logically adjacent grouping of size $1 \times 2^m$ results: the 1 appearing in the product is the width of the column. In other words, the logic function for feedback output 1 (i.e. the first bit encoding) is independent of the present state in the column indexing the input. Thus the constraints to realise the saving are automatically satisfied.

For example, it can be seen that the column with input 000 contains the states 1 and 3. If 1 is assigned as the first bit encoding to states 1 and 3, the logic implementation of the part of the machine receiving the input 000 given by Table 8 below.

TABLE 8

| Input | Present State | Next State |
| --- | --- | --- |
| 000 | 1 | 3 |
| 000 | 2 | 1 |
| 000 | 3 | 3 |
| 000 | 4 | 3 |
| 000 | 5 | 1 |
| 000 | 6 | 1 |
| 000 | 7 | 3 |

Thus for feedback output 1, the logic implementation is as shown in Table 9 below:

TABLE 9

| Input | Encoding of Present State | Feedback Output 1 |
| --- | --- | --- |
| 000 | --- | 1 |

It should be noted from Table 9 that the encoding of the present states is irrelevant. An input of 000 will always result in a feedback output of 1 since the next state always lies in the set {1,3}.

A further proposed way of grouping is to consider logically adjacent columns. Suppose there are four vertically adjacent columns and a collection of states appearing in those columns is at most $2^m/2$ states. There is thus a logically adjacent group of size $4 \times 2^m$. This results in an even bigger saving than in the previous proposed way of grouping, with the constraints automatically satisfied. For example, it can be seen that columns 001, 011, 101, and 111 are logically adjacent, comprising the block --1, and contain the states 1,2,3, and 5. If 1 is assigned as the first bit encoding to states 1,2,3, and 5, the part of the machine is given by Table 10 below for the input --1.

TABLE 10

| Input | Present State | Next State |
| --- | --- | --- |
| 001 | 1 | 5 |
| 001 | 2 | 1 |
| 001 | 3 | 5 |
| 001 | 4 | 5 |
| 001 | 5 | 1 |
| 001 | 6 | 5 |
| 001 | 7 | 5 |
| 011 | 1 | 3 |
| 011 | 2 | 2 |
| 011 | 3 | 3 |
| 011 | 4 | 3 |
| 011 | 5 | 2 |
| 011 | 6 | 3 |
| 011 | 7 | 3 |
| 101 | 1 | 5 |
| 101 | 2 | 1 |

TABLE 10-continued

| Input | Present State | Next State |
| --- | --- | --- |
| 101 | 3 | 5 |
| 101 | 4 | 5 |
| 101 | 5 | 2 |
| 101 | 6 | 2 |
| 101 | 7 | 2 |
| 111 | 1 | 3 |
| 111 | 2 | 3 |
| 111 | 3 | 3 |
| 111 | 4 | 3 |
| 111 | 5 | 1 |
| 111 | 6 | 1 |
| 111 | 7 | 1 |

Thus for the assigned feedback output (i.e. first encoded bit) of 1, the part of the machine takes the form as given in Table 11 below:

TABLE 11

| Input | Encoding of Present State | Feedback Output 1 |
| --- | --- | --- |
| --1 | --- | 1 |

Thus based on the above principles, logical groupings of columns can be arrived at which result in a state assignment leading to large savings in the implementation of the first bit encoding of the next state function. It is required in this minimal length encoding embodiment that at most $2^m/2$ of the states are in one set and at most $2^m/2$ in the second set. There must exist a single logically adjacent block of columns (inputs) which contain at most $2^m/2$ of the states and the states which are not present in the block also number at most $2^m/2$ of the states. This will lead to a bit encoding which provides a saving in the logical implementation.

If blocks exist which contain less than the required number of states, i.e. number of states in the complementary set is greater than $2^m/2$, sets can be unioned to provide the required number. This will result in a logically adjacent block which will be set to 1's if the bit encoding is set to 1 for the states in the set.

Since it is known in the theory of logic minimisation that larger logically adjacent blocks of 1's lead to larger savings in the logical implementation, the method attempts to identify maximally logically adjacent groupings i.e. those that cannot be extended without increasing the number of states appearing in the logically adjacent columns to greater than $2^m/2$.

Details of the method of state assignment of the finite state machine in this embodiment will now be described with reference to FIGS. 5 to 10.

Figure 5:
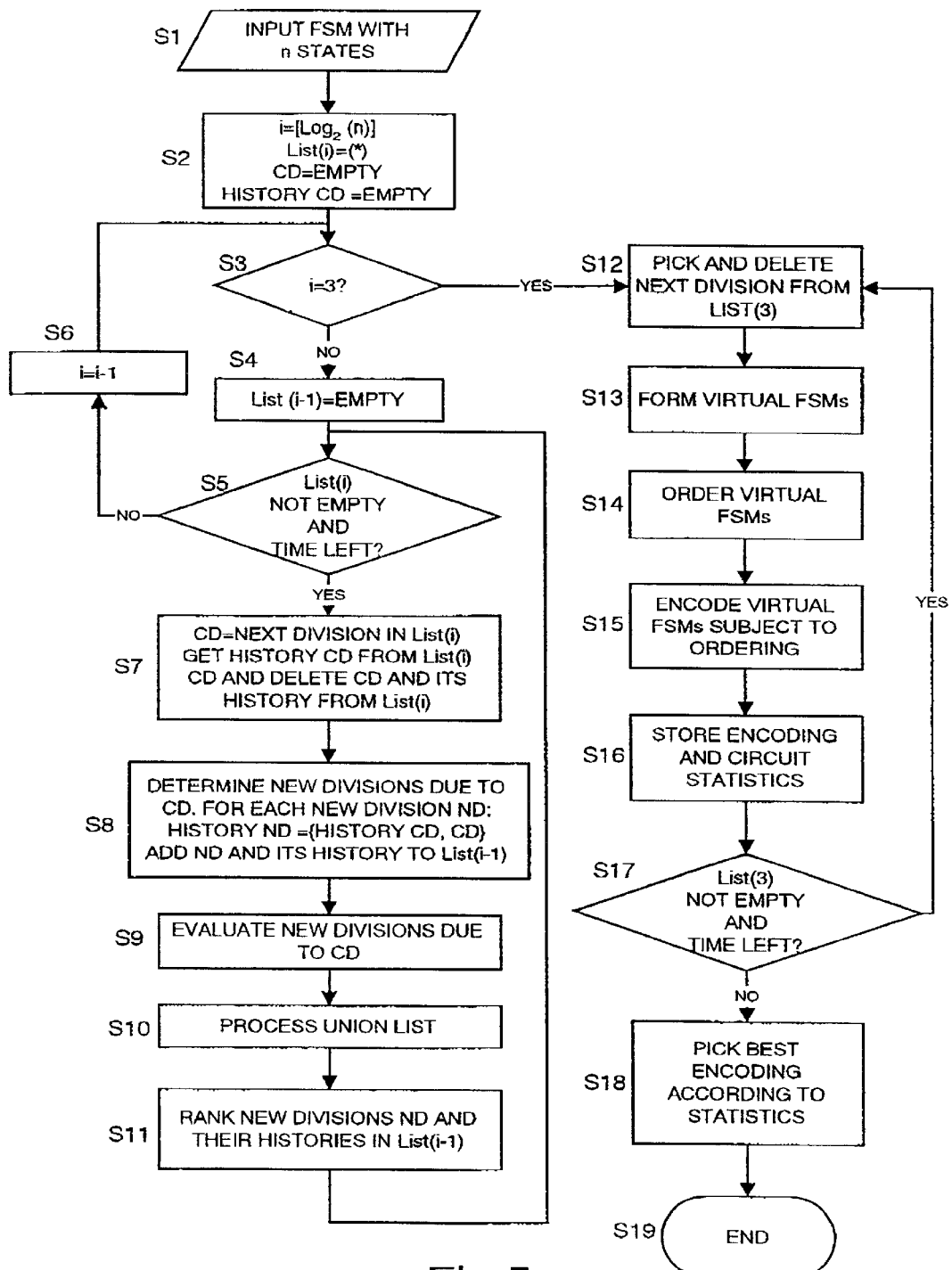
FIG. 5 is a flow diagram illustrating the process of minimal length state assignment for a finite state machine in accordance with a first embodiment of the present invention.

FIG. 5 is a flow diagram of the method implemented to assign states to the finite state machine This technique performs a "breadth first" search technique on the divisions since all the possible divisions for each bit encoding are determined and are evaluated. In this way, the "tree structure" illustrated in FIG. 4 is traversed in a breadth wise manner.

Referring specifically now to FIG. 5, in step S1 the data for the finite state machine is input. The number of states in the finite state machine is defined by n.

In step S2 a bit encoding counter i is set to $[\log_2(n)]$. A list for the current encoding i is set to a default value which is not empty. The current division (CD) is defined as empty and the history of the current division is also set as being empty.

In step S3 it is determined whether i=3. The reason for this is that in this embodiment the predetermined number of encodings which are to be exactly encoded is set to 3. In other words, when the number of mnemonics is 8 or less, the method will perform an exact evaluation Assuming in the first pass through i >3, in step S4 the list for determined divisions i.e. next encoded bit is set to EMPTY. In step S5 it is determined whether the list for the current encoding is empty and also if there is still time left to process it. If so, in step S7 the is current division (CD) is set to the next division in the list for the current encoding. The history of the current division is also obtained from the list of the current encoding and the current division and the history for the current division are deleted from the list for the current bit encoding. On the first pass through the flow diagram, List (i) is not empty and thus in step S5 the process proceeds to step S7, but in step S7 there are no divisions in List (i).

In step S8 the process determines new divisions (ND) and for each new division the history equals the history of the current division with reference to the current division The new divisions (ND) and their histories are added to the List (i-1), for the next bit encoding. The new divisions are then evaluated in step S9 and in step S10 sets which are too small are unioned with reference to the union list. In step S11 the new divisions (ND) and their histories are ranked in the list for the next encoding (List (i-1))) The process then returns to step S5. Thus steps S5 to S11 are repeated for each current division for the current encoding (given in list (i)). This is repeated until they are all processed or until the processing time has expired. Thus in this way, it is possible to "prune" the search by providing limited processing time. When all of the divisions for a bit encoding have been processed or the processing time has expired, in step S6 the bit encoding counter i is decremented and the process returns to step S3. In this way the search moves down the tree to the next level (see FIG. 4).

When finally the divisions have been processed to a point at which the number of encoded bits left is 3, in step S12 the next division from the list of divisions to be encoded is picked and deleted. Virtual finite state machines are formed for the division in step S13 and in step S14 the virtual finite state machines are ordered. The virtual finite state machines are then encoded subject to the ordering in step S15. Encoding and circuits statistics for the encoding are then stored in step S16 and in step S17 it is determined whether all of the divisions have been processed or the processing time has expired. It the processing time has not expired, and there are still more divisions left to be processed, the process returns to step S12. If the processing time has expired or there are no more divisions left to be pressed, in step S18 the best encodings are selected according to the stored statistics The process then terminates in step S19.

Although this embodiment uses the evaluation step this is not essential. Ranking can then be carried out by first ranking those divisions not obtained from the union list by their width and then using the divisions obtained from the union list ranked arbitrarily.

Figure 6:
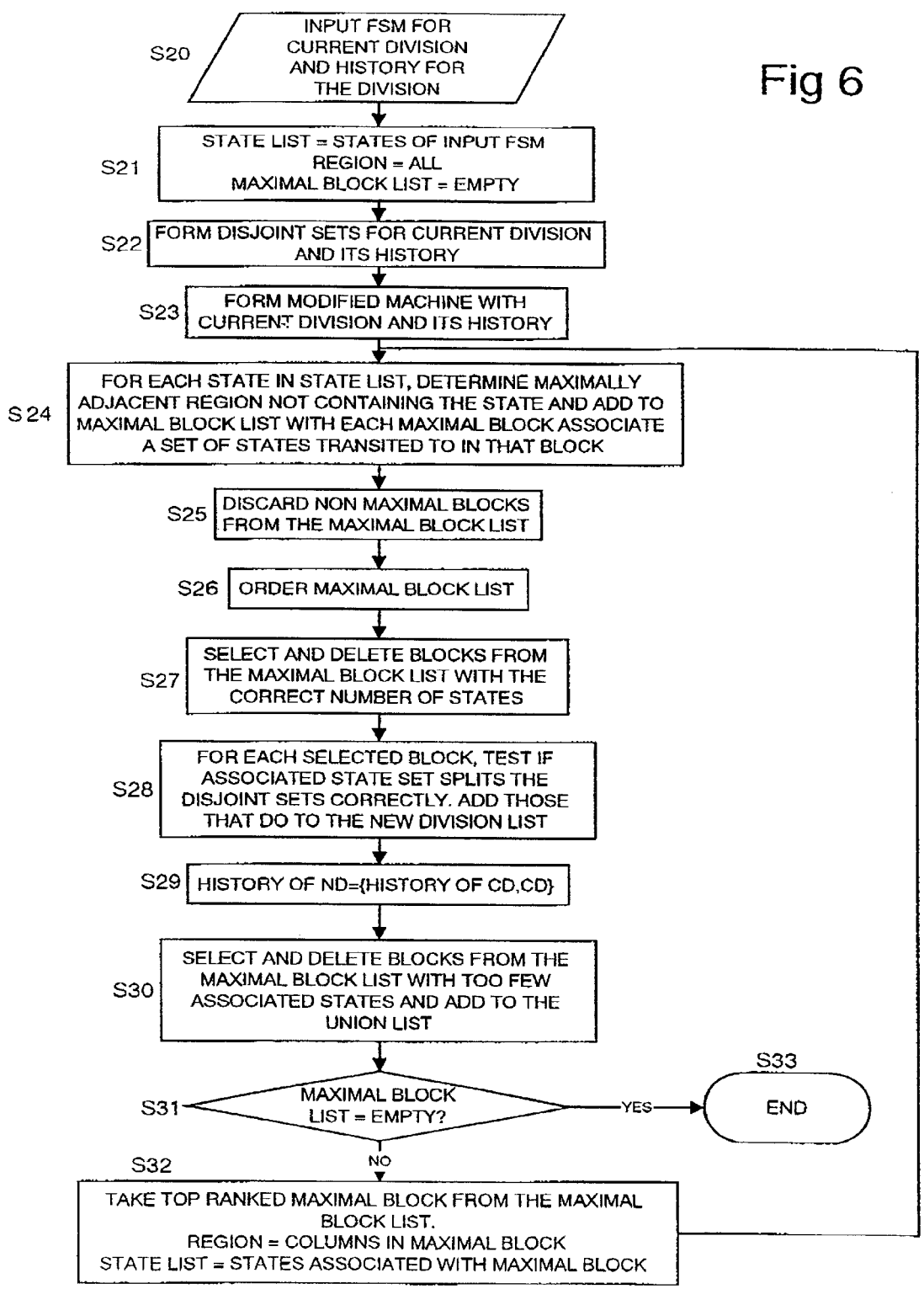
FIG. 6 is a flow diagram illustrating the step of determining new divisions in FIG. 5 in more detail.

The process of determining the new divisions (step S8 of FIG. 5) will now be described in more detail with reference to the flow diagram of FIG. 6.

In step S20 the finite state data for the current division and history for the current division are input. In step S21 a state list is set to the states of the input FSM data. The region to be searched is set to all as a default. A maximal block list is initially set as empty.

In step S22 disjoint sets for the current division and its history are formed. For the first pass through the flow diagram of FIG. 5, no divisions have yet been determined and thus there are no disjoint sets to be formed.

In step S23 a modified machine is formed with the current division and its history. Once again in the first pass through the flow diagram, there is no modified machine to be formed since no divisions have been determined. Thus the machine formed comprises the full finite state machine.

Then for each state in the state list a maximally adjacent region not containing the state is determined and added to the maximal block list in step S24. Also a set of states transited to for each maximal block are associated with each respective maximal block. In step S25 non maximal blocks are discarded from the maximal block list and the maximal block list is then ordered (in step S26). In step S27 blocks which have the correct number of states are selected and deleted from the maximal block list. The selected blocks are tested to determine if the associated state set splits the disjoint set correctly and if so they are added to the new division list in step S28. In step S29 the history of the new divisions is set to the history of the current divisions with reference to the current divisions.

Any blocks with too few associated states are deleted from the maximal block list and added to the union list. If the maximal block list is empty (in step S31) the process then terminates in step S33. If however, there are further maximal blocks in the maximal block list, in step S32 the top ranked maximal block is taken from the maximal block list. The region is set to the columns in the maximal block and the state list is set to the states associated with the maximal block. The process then returns to step S24 for the processing of the states in the maximal block.

Thus this process is a technique for computing all maximally adjacent collections of columns which contain at most $2^m/2$ states.

This technique will now be described in more detail with reference to the state transition data given for this embodiment in Table 3.

As mentioned hereinabove, maximally adjacent columns are sought which contain at most $2^m/2$ states. Clearly any such collection of columns cannot contain at least one of the states. In other words, any such collection of columns must be contained in a maximally adjacent block not containing one of the states. Thus, for each state all maximal groupings of columns which do not contain this state are determined. For each such grouping all the other states which are also not present in the given group are determined. By complimenting this set of states, a set of adjacent collection of columns are arrived at that contain at most n-1 states. By choosing the maximal collection in this set, all maximally adjacent collection of columns width at most n-1 states are arrived at.

This method will now be described with reference to the example.

To each input the set of states is associated which comprise the next states which can be transited to from any state under the above mentioned input. That is, the states appearing in the column indexed by the input. In the above example, the associations are given in Table 12 below:

TABLE 12

| Input | Column Sets |
|-------|-------------|
| 000   | 1,3         |
| 001   | 1,5         |
| 011   | 2, 3        |
| 010   | 2, 6, 7     |
| 110   | 1, 4, 5     |

TABLE 12-continued

| Input | Column Sets |
|---|---|
| 111 | 1, 3 |
| 101 | 1, 2, 5 |
| 100 | 2, 4 |

This association can be viewed on a Karnaugh map as given in Table 13 below:

TABLE 13

|  | 0 | 1 |
|---|---|---|
| 00 | {1, 3} | {2, 4} |
| 01 | {1, 5} | {1, 2, 5} |
| 11 | {2, 3} | {1, 3} |
| 10 | {2, 6, 7} | {1, 4, 5} |

For each state a logic function is formed which is true if the state is not present in the column set associated to the input. All maximally adjacent blocks which cover the function are computed. Table 14 below indicates maximally adjacent blocks not containing state 1.

TABLE 14

|  | 0 | 1 |
|---|---|---|
| 00 | 0 | 1 |
| 01 | 0 | 0 |
| 11 | 1 | 0 |
| 10 | 1 | 0 |

Thus the maximally adjacent blocks not containing state 1 are: 01-, 100.

The maximally adjacent blocks not containing state 2 are given in Table 15 below:

TABLE 15

|  | 0 | 1 |
|---|---|---|
| 00 | 1 | 0 |
| 01 | 1 | 0 |
| 11 | 0 | 1 |
| 10 | 0 | 1 |

Thus the maximally adjacent blocks not containing state 2 are: 00-, 11-.

The maximally adjacent blocks not containing state 3 are given in Table 16 below:

TABLE 16

|  | 0 | 1 |
|---|---|---|
| 00 | 0 | 1 |
| 01 | 1 | 1 |
| 11 | 0 | 0 |
| 10 | 1 | 1 |

Thus the maximally adjacent blocks not containing state 3 are: 10-, -01, -10, 1-0.

The maximally adjacent blocks not containing state 4 are given in Table 17 below:

TABLE 17

|  | 0 | 1 |
|---|---|---|
| 00 | 1 | 0 |
| 01 | 1 | 1 |
| 11 | 1 | 1 |
| 10 | 1 | 0 |

Thus the maximally adjacent states not containing state 4 are; 0--, --1.

The maximally adjacent blocks not containing state 5 are given in Table 18 below:

TABLE 18

|  | 0 | 1 |
|---|---|---|
| 00 | 1 | 1 |
| 01 | 0 | 0 |
| 11 | 1 | 1 |
| 10 | 1 | 0 |

Thus the maximally adjacent blocks not containing state 5 are: -00, -11, 01-, 0-0.

The maximally adjacent blocks not containing state 6 are given in Table 19 below:

TABLE 19

|  | 0 | 1 |
|---|---|---|
| 00 | 1 | 1 |
| 01 | 1 | 1 |
| 11 | 1 | 1 |
| 10 | 0 | 1 |

Thus the maximally adjacent blocks not containing, state 6 are; 1--, -0-, --1.

The maximally adjacent blocks not containing state 7 are given in Table 20 below:

TABLE 20

|  | 0 | 1 |
|---|---|---|
| 00 | 1 | 1 |
| 01 | 1 | 1 |
| 11 | 1 | 1 |
| 10 | 0 | 1 |

Thus the maximally adjacent blocks not containing state 7 are: 1--, -0-, --1.

Each maximally adjacent block not containing a different state is now considered. All the other states which are also not present in the collection of columns comprising the given maximally adjacent blocks need to be computed. Consider the maximally adjacent region, subject to the condition that it does not contain state 1, 01-, it is known that this does not contain state 1. It is clear that some other state is not present in this block if and only if 01- is contained in or equal to some maximal block due to some other state. It can be seen that 01- is contained in or equal to 0-- and 01-. The first is a maximal block not containing state 4 and the second is a maximal block not containing state 5. Thus 01- is a maximal block not containing states 1,4 and 5. That is 01- is a maximally adjacent region containing the states 2,3,6 and 7. Repeating this procedure for each of the maximal regions defined by each state results in the list of maximally adjacent regions not containing at least one state and the states that they do contain which is given in Table 21 below:

TABLE 21

| Adjacent blocks of columns with at most 6 states | States contained in block |
|---|---|
| 01- | 2, 3, 6, 7 |
| 100 | 2, 4 |
| 11- | 1, 3, 4, 5 |
| 00- | 1, 3, 5 |
| 10- | 1, 2, 4, 5 |
| -01 | 1, 2, 5 |
| -10 | 1, 2, 4, 5, 6, 7 |
| 1-0 | 1, 2, 4, 5 |
| 0-- | 1, 2, 3, 5, 6, 7 |
| --1 | 1, 2, 3, 5 |
| -11 | 1, 2, 3 |
| -00 | 1, 2, 3, 4 |
| 0-0 | 1, 2, 3, 6, 7 |
| 1-- | 1, 2, 3, 4, 5 |
| -0- | 1, 2, 3, 4, 5 |

By choosing maximal blocks i.e. by throwing away adjacent blocks which contain other adjacent blocks, the maximally adjacent blocks can be obtained as given in Table 22 below:

TABLE 22

| Maximally adjacent blocks of columns with at most 6 states | States contained in block |
|---|---|
| --1 | 1, 2, 3, 5 |
| 1-- | 1, 2, 3, 4, 5 |
| -0- | 1, 2, 3, 4, 5 |
| 0-- | 1, 2, 3, 5, 6, 7 |
| -10 | 1, 2, 4, 5, 6, 7 |

Of the above blocks, Table 23 below gives the blocks which are of the correct size to form a candidate division.

TABLE 23

| Maximally adjacent blocks of correct size for co-ordinate | States contained in block |
|---|---|
| --1 | 1, 2, 3, 5 |

Table 24 below shows all maximally adjacent blocks which do not contain at least one state, but which are too large to form a candidate division.

TABLE 24

| Maximally adjacent blocks with too many states | States contained in block |
|---|---|
| 1-- | 1, 2, 3, 4, 5 |
| -0- | 1, 2, 3, 4, 5 |
| 0-- | 1, 2, 3, 5, 6, 7 |
| -10 | 1, 2, 4, 5, 6, 7 |

It is thus necessary to compute all maximally adjacent blocks from which a candidate division can be formed. By restricting processing to the columns in the block 1-- and repeating the process as before, but only for the states 1,2,3,4, and 5, all maximally adjacent blocks in the adjacent block 1-- can be computed. It should be noted that this process will either result in no blocks containing at most 4 states, or will lead to maximally adjacent blocks with at most 4 states. The restricted column Karnaugh map given in Table 25 is formed.

TABLE 25

|   | 0 | 1 |
|---|---|---|
| 0 | {2, 4} | {1, 4, 5} |
| 1 | {1, 2, 5} | {1, 3} |

The process then proceeds as before to determine maximally adjacent blocks not containing a state. Tables 26 to 30 are Karnaugh maps identifying maximally adjacent blocks that do not contain states 1, 2, 3, 4 and 5 respectively.

TABLE 26

|   | 0 | 1 |
|---|---|---|
| 0 | 1 | 0 |
| 1 | 0 | 0 |

TABLE 27

|   | 0 | 1 |
|---|---|---|
| 0 | 0 | 1 |
| 1 | 0 | 1 |

TABLE 28

|   | 0 | 1 |
|---|---|---|
| 0 | 1 | 1 |
| 1 | 1 | 0 |

TABLE 29

|   | 0 | 1 |
|---|---|---|
| 0 | 0 | 0 |
| 1 | 1 | 1 |

TABLE 30

|   | 0 | 1 |
|---|---|---|
| 0 | 1 | 0 |
| 1 | 0 | 1 |

It can be seen from Table 26 that the maximally adjacent block within 1-- which does not contain state 1 is: 00.

It can be seen from Table 27 that the maximally adjacent block within 1-- which does not contain state 2 is: 1-.

It can be seen from Table 26 that the maximally adjacent blocks within 1-- which do not contain state 3 are: 0-, -0.

It can be seen from Table 29 that the maximally adjacent block within 1-- which does not contain state 4 is: -1.

It can be seen from table 30 that the maximally adjacent blocks within 1-- which do not contain state 5 are: 00, 11.

By proceeding in this manner for all maximal blocks which are too large, it can be seen that all maximally adjacent blocks with at most $2^m/2$ states are computed. It should be noted that it is guaranteed that every maximal block appearing in this manner will contain at most n-2 states. Thus the blocks which are too large, (i.e. contain too many states) are ordered lexicographically, first by their first size and then by the number of states that they contain are ordered in the list. In this way the largest block with at most $2^m/2$ states is likely to be arrived at the in fastest computational time. However, if computational time is of the essence, the blocks can be ordered by ascending number of states and then by block size.

As mentioned hereinabove, once a candidate division has been chosen, further information about adjacent states become available. The method for exploiting this information will now be described.

For any candidate division determined as described hereinabove, a second division of the n states into two disjoint subsets each containing at most $2^m/2$ states is required. As before, the bit encoding for the division will be set to 1 for the state in one of the two sets and to 0 for the states in the other. Once this is done, each state will have two bit encodings, from the list 00, 01, 11 and 10, associated with it. In other words there are at most four disjoint sets. Since minimal :length encodings are sought, it is required that each of these four sets contain at most $2^m/4$ states.

For any first bit encoding determined, a new machine is formed (a modified finite state machine) which has one extra input and one extra output, the input being 0 if the present state of the machine belongs to one of the chosen sets and 1 if it belongs to the complementary set. The output is 0 if the next state of the machine belongs to one of the chosen sets and 1 if it belongs to the complementary set. For the set 1, 2, 3, 5 encoded by 1 the set 4, 6, 7 encoded by 0 (as shown on the left hand side of FIG. 4) Table 31 below illustrates the modified machine.

As before, maximal adjacent blocks with most $2^m/2$ states are sought. It should be noted that any block that is found will again have its constraints automatically satisfied since it will either be:

1. A collection of columns from the original machine and so the logic implementation will be independent of the present state of the block; or
2. A collection of columns from the modified machine.

It should be noted that any such collection has all its present states encoded either by 1 or 0 and not both This implies that the logic implementation of the block must be independent of the present states comprising one of the disjoint sets determined by the first bit encoding.

The second saving will now be demonstrated.

By examining the table it can be seen that the block 10-0 (a collection of columns from the modified machine) contains the states 2, 4, 5. If 1 is assigned to the states and 0 is assigned to the complementary states 1, 3, 6, 7, then the four resulting sets and their encodings axe given in Table 33 below:

TABLE 33

| Encodings | States with encoding |
|---|---|
| 00 | 6, 7 |
| 01 | 4 |

TABLE 31

| Present States | Inputs | | | | | | | | | | | | | | | |
|---|---|---|---|---|---|---|---|---|---|---|---|---|---|---|---|---|
| | 1 | 0011 | 0111 | 0101 | 1101 | 1111 | 1011 | 1001 | 0000 | 0010 | 0110 | 0100 | 1100 | 1110 | 1010 | 1000 |
| 1 | 3/ 0001 | 5/ 0001 | 3/ 0101 | 6/ 0100 | 4/ 0110 | 3/ 0101 | 5/ 0101 | 4/ 0000 | — | — | — | — | — | — | — | — |
| 2 | 1/ 0101 | 1/ 0011 | 2/ 0011 | 2/ 0001 | 5/ 0011 | 3/ 0011 | 1/ 0001 | 2/ 0101 | — | — | — | — | — | — | — | — |
| 3 | 3/ 1001 | 5/ 1001 | 3/ 0101 | 6/ 0100 | 4/ 0100 | 3/ 0101 | 5/ 0101 | 4/ 1000 | — | — | — | — | — | — | — | — |
| 5 | 1/ 0101 | 1/ 0011 | 2/ 0011 | 2/ 1011 | 1/ 1011 | 1/ 1001 | 2/ 1001 | 2/ 0101 | — | — | — | — | — | — | — | — |
| 4 | — | — | — | — | — | — | — | — | 3/ 0001 | 5/ 0001 | 3/ 1011 | 7/ 1000 | 5/ 0011 | 3/ 0011 | 5/ 1011 | 4/ 0000 |
| 6 | — | — | — | — | — | — | — | — | 1/ 0101 | 5/ 1011 | 3/ 1011 | 2/ 1011 | 1/ 1011 | 2/ 1001 | 2/ 1001 | 2/ 0101 |
| 7 | — | — | — | — | — | — | — | — | 3/ 1001 | 5/ 1001 | 3/ 1011 | 2/ 1011 | 1/ 1011 | 1/ 1001 | 2/ 1001 | 4/ 1000 |

The process of finding maximal adjacent blocks with at most $2^m/2$ states can now be repeated on this modified machine. It is further required that each of the four sets resulting from the combination of the two bit encodings have at most $2^m/4$ states. The Karnaugh map is formed as before and illustrated in Table 32 below:

TABLE 32

| | 00 | 01 | 11 | 10 |
|---|---|---|---|---|
| 00 | {1, 3} | {1, 2, 7} | {1, 5} | {2, 4} |
| 01 | {1, 3} | {1, 2, 6} | {1, 4, 5} | {1, 2, 4} |
| 11 | {1, 5} | {2, 3} | {1, 3} | {1, 2, 5} |
| 10 | {5} | {3} | {1, 3} | {2, 5} |

TABLE 33-continued

| Encodings | States with encoding |
|---|---|
| 11 | 2, 5 |
| 10 | 1, 3 |

It can be seen that each of the four sets has at most 8/4=2 states. For feedback output 2, the part of the machine is given in Table 34 below:

TABLE 34

| Input | Present State | Next State |
|---|---|---|
| 100 | 4 | 4 |
| 100 | 6 | 2 |
| 100 | 7 | 4 |

TABLE 34-continued

| Input | Present State | Next State |
|---|---|---|
| 101 | 4 | 5 |
| 101 | 6 | 2 |
| 101 | 7 | 2 |

If the second bit encoding i.e. the second feedback output is encoded as 1 for the set of states 2,4,5, Table 35 below illustrates the result.

TABLE 35

| Input | Encoding of Present State | Output |
|---|---|---|
| 10- | 0-- | 1 |

It should be noted that the last two bits of the encoding of the present state are "don't cares" due to independence from the present states encoded by 0, by the first bit encoding.

Table 36 below shows all maximally adjacent blocks in the modified machine which do not contain at least one of the states. Any block ending with a "don't care", e.g. 01--, is a maximally adjacent block of columns from the original machine and so has its constraints automatically satisfied. Any block ending in 0, e.g. ---0, lies entirely in the bottom left hand corner of the modified machine and any block ending in 1, e.g. 10-1, lies entirely in the top left hand corner. As already demonstrated, in both of the later cases the constraints are also already satisfied.

TABLE 36

| Adjacent blocks of columns in modified machine with at most 6 states | States in block |
|---|---|
| 01-- | 2, 3, 6, 7 |
| 100- | 2, 4 |
| 10-0 | 2, 4, 5 |
| 0-10 | 3, 5 |
| -010 | 2, 5 |
| 11-- | 1, 3, 4, 5 |
| 00-- | 1, 3, 5 |
| -110 | 1, 3 |
| 10-- | 1, 2, 4, 5 |
| -01- | 1, 2, 5 |
| -10- | 1, 2, 4, 5, 6, 7 |
| 1-0- | 1, 2, 4, 5 |
| 0--- | 1, 2, 3, 5, 6, 7 |
| --1- | 1, 2, 3, 5 |
| -1-0 | 1, 2, 3, 5, 7 |
| -11- | 1, 2, 3 |
| -00- | 1, 2, 3, 4 |
| 0-0- | 1, 2, 3, 6, 7 |
| 1--- | 1, 2, 3, 4, 5 |
| -0-- | 1, 2, 3, 4, 5 |
| ---0 | 1, 2, 3, 4, 5, 7 |
| ---1 | 1, 2, 3, 4, 5, 6 |

If 01-- is chosen (a collection of columns from the original machine) with associated states 2,3,6 and 7, and 1 is assigned to these states and 0 is assigned to the states 1,4, and 5 (the complementary set), then the four resulting sets and their encodings are given in Table 37 below:

TABLE 37

| Encodings | States with encoding |
|---|---|
| 00 | 4 |
| 01 | 6, 7 |
| 11 | 2, 3 |
| 10 | 1, 5 |

For feedback output 2, the following part of the machine is given in Table 38 below:

TABLE 38

| Input | Present State | Next State |
|---|---|---|
| 010 | 1 | 6 |
| 010 | 2 | 2 |
| 010 | 3 | 6 |
| 010 | 4 | 7 |
| 010 | 5 | 2 |
| 010 | 6 | 2 |
| 010 | 7 | 2 |
| 011 | 1 | 3 |
| 011 | 2 | 2 |
| 011 | 3 | 3 |
| 011 | 4 | 3 |
| 011 | 5 | 2 |
| 011 | 6 | 3 |
| 011 | 7 | 3 |

With the encoding of states 2,3,6 and 7 as 1, Table 38 can be expressed as given in Table 39 below:

TABLE 39

| Input | Encoding of Present State | Output |
|---|---|---|
| 01- | --- | 1 |

As before, the maximally adjacent blocks which do not contain at least one state, but which are too large to form a division, can be explored further. For example, ---0 contains the states 1,2,3,4,5 and 7. Thus by restricting the column Karnaugh map to ---0 results in Table 40 below:

TABLE 40

|   | 00 | 01 | 11 | 10 |
|---|---|---|---|---|
| 0 | {1, 3} | {1, 2, 7} | {1, 5} | {2, 4} |
| 1 | {5} | {3} | {1, 3} | {2, 5} |

This can be searched as before to arrive at further maximally adjacent blocks and associated sets which may lead to divisions.

The method of evaluating the encoding of new divisions (step S9 of FIG. 5) will now be described in more detail with reference to the flow diagram of FIG. 7.

In step S8 of FIG. 5 new divisions are determined. However, it is desirable not to have to process all divisions but rather to select the best divisions which are likely to result in logic savings. This is achieved in this embodiment by evaluating the new divisions by reference to a cost function which is related to the outputs of the modified finite state machine for the division. As a result of the determination of the cost function the new divisions can be ranked (step S11) in the list and are thus processed on a priority based upon their ranking.

Figure 7:
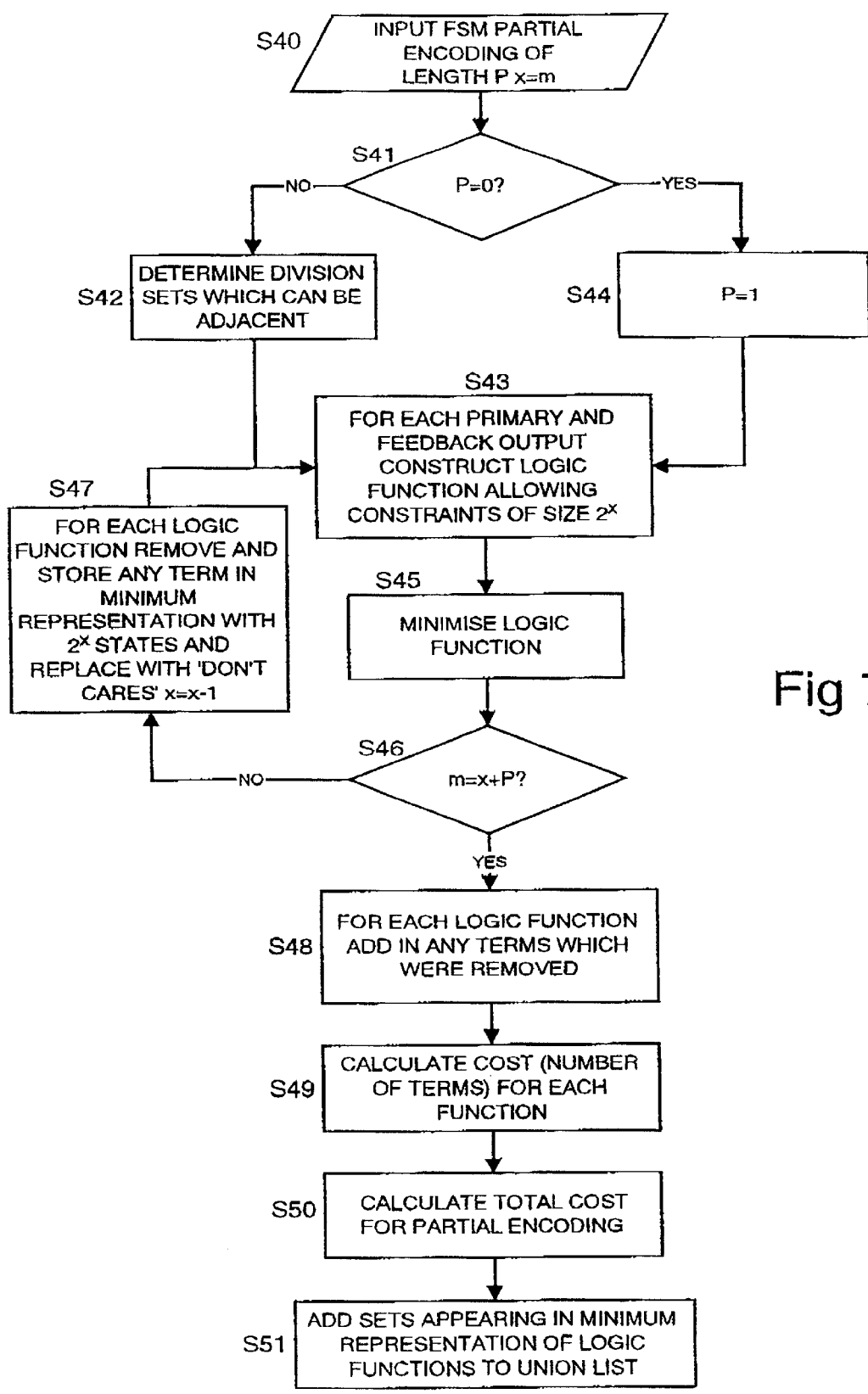
FIG. 7 is a flow diagram illustrating the step of evaluating the new divisions in FIG. 5 in more detail.

FIG. 7 is a flow diagram illustrating the method of evaluating new divisions for the minimal length encoding technique of this embodiment. In step S40 the partial encoding of length p is input for the finite state machine and x is set to m. In step S41 it is determined whether the partial encoding length is 0. If so, in step S41 p is set to 1 and if not in step S42 it is determined which division sets can be adjacent The process then proceeds to step S43 in which a logic function for each primary and feedback output constructed allowing constraints of size $2^x$. The logic function is then mininised in step S45 and in step S46 it is then determined whether m=x−1+p. If not, in step S47 for each logic function any term in the minimum representation with $2^x$ states is removed and replace with "don't cares". x is then decremented and the process returns to step S43. If in step S46 m=x−1+p, in step S48, for each logic function any terms which were removed are added in. The cost (number of terms) for each function is then calculated in step S49 and in step S50 the total cost for partial encoding is calculated. In step S51 the sets appearing in the minimum representation of logic functions are added to the union list.

Thus this technique establishes approximate minimum cost of the primary outputs and feedback outputs taking into account the partial state encoding due to the candidate division and previously picked divisions. This allows an informed decision on which partial assignment to pursue further for complete state assignment. This technique will now be described in more detail with reference to the example and the second bit encoding.

If the complete encoding of states is known, the exact cost of any output function is completely determined by all the powers of two adjacency relationships between the states when all adjacency relationships are considered simultaneously.

However, if only a partial encoding is known, then some of the adjacency relationships are still to be defined while others have been completely defined. The method of this embodiment of the present invention calculates an approximate minimum cost taking into account all powers of two adjacency relationships already defined and the method attempts to do so in a simultaneous fashion. This is achieved for all primary outputs and the feedback outputs defined by the partial encoding. Consider the example in which the two encodings which result in the disjoint sets and the encodings illustrated in Table 41 have been chosen.

TABLE 41

| Encoding | State set |
|---|---|
| 00 | 4, 8 |
| 01 | 6, 7 |
| 11 | 2, 3 |
| 10 | 1, 5 |

On a Karnaugh map, this can be presented as given in Table 42 below:

TABLE 42

|  | 0 | 1 |
|---|---|---|
| 0 | 4, 8 | 1, 5 |
| 1 | 6, 7 | 2, 3 |

Since 00 and 11 do not lie in an adjacent block on a Karnaugh map, the fact that no state from the set {4,8} can ever be adjacent to a state from the set {2,3} and vice-versa is arrived at Likewise, since 01 and 10 do not lie in an adjacent block, no state from the set {6,7} can be adjacent to a state from {1,5} and vice-versa.

It should be noted however, that 00, 11, 01 and 10 together do lie in the adjacent block -- on a Karnaugh map, and so the set of all the states {1,2,3,4,5,6,7,8} is an adjacent set.

The aim is to calculate the minimum cost for each primary and feedback output, taking into account these constraints.

The minimum cost is calculated by constructing a logic function for each output that will be minimised by a logic minimiser. This constructed logic function will express both the output function and the adjacency constraints imposed on the states by the partial encoding.

Table 43 below illustrates the logic function for feedback output 2:

TABLE 43

| Present States | Inputs | | | | | | | |
|---|---|---|---|---|---|---|---|---|
|  | 000 | 001 | 011 | 010 | 110 | 111 | 101 | 100 |
| 1 | 1 | 0 | 1 | 1 | 0 | 1 | 0 | 0 |
| 2 | 0 | 0 | 1 | 1 | 0 | 1 | 0 | 1 |
| 3 | 1 | 0 | 1 | 1 | 0 | 1 | 0 | 0 |
| 4 | 1 | 0 | 1 | 1 | 0 | 1 | 0 | 0 |
| 5 | 0 | 0 | 1 | 1 | 0 | 0 | 1 | 1 |
| 6 | 0 | 0 | 1 | 1 | 0 | 0 | 1 | 1 |
| 7 | 1 | 0 | 1 | 1 | 0 | 0 | 1 | 0 |
| 8 | — | — | — | — | — | — | — | — |

Logic functions which express the fact that the set {1,2,3,4,5,6,7,8} lies in an adjacent block is first-constructed. This can be viewed on a Karnaugh map as illustrated in Table 44 below:

TABLE 44

|  | 00 | 01 | 11 | 10 |
|---|---|---|---|---|
| 00 | T(4, 8) | T(−) | T(−) | T(−) |
| 01 | T(−) | T(6, 7) | T(−) | T(−) |
| 11 | T(−) | T(−) | T(2, 3) | T(−) |
| 10 | T(−) | T(−) | T(−) | T(1, 5) |

The indexing row and the column both contain the partial encoding of all disjoint sets, which allows the adjacency constraints between them to be expressed. Each T is a table of all inputs against all states. The tables on the diagonal represent the output function and the off-diagonal tables represent the adjacency constraints.

Table 45 below is the T(4,8) table.

TABLE 45

| Present States | Inputs | | | | | | | |
|---|---|---|---|---|---|---|---|---|
|  | 000 | 001 | 011 | 010 | 110 | 111 | 101 | 100 |
| 1 | — | — | — | — | — | — | — | — |
| 2 | — | — | — | — | — | — | — | — |
| 3 | — | — | — | — | — | — | — | — |
| 4 | 1 | 0 | 1 | 1 | 0 | 1 | 0 | 0 |
| 5 | — | — | — | — | — | — | — | — |
| 6 | — | — | — | — | — | — | — | — |
| 7 | — | — | — | — | — | — | — | — |
| 8 | — | — | — | — | — | — | — | — |

Table 46 below is the T(6,7) table:

TABLE 46

| Present States | Inputs | | | | | | | |
|---|---|---|---|---|---|---|---|---|
| | 000 | 001 | 011 | 010 | 110 | 111 | 101 | 100 |
| 1 | — | — | — | — | — | — | — | — |
| 2 | — | — | — | — | — | — | — | — |
| 3 | — | — | — | — | — | — | — | — |
| 4 | — | — | — | — | — | — | — | — |
| 5 | — | — | — | — | — | — | — | — |
| 6 | 0 | 0 | 1 | 1 | 0 | 0 | 1 | 1 |
| 7 | 1 | 0 | 1 | 1 | 0 | 0 | 1 | 0 |
| 8 | — | — | — | — | — | — | — | — |

Table 47 below is the T(2,3) table:

TABLE 47

| Present States | Inputs | | | | | | | |
|---|---|---|---|---|---|---|---|---|
| | 000 | 001 | 011 | 010 | 110 | 111 | 101 | 100 |
| 1 | — | — | — | — | — | — | — | — |
| 2 | 0 | 0 | 1 | 1 | 0 | 1 | 0 | 1 |
| 3 | 1 | 0 | 1 | 1 | 0 | 1 | 0 | 0 |
| 4 | — | — | — | — | — | — | — | — |
| 5 | — | — | — | — | — | — | — | — |
| 6 | — | — | — | — | — | — | — | — |
| 7 | — | — | — | — | — | — | — | — |
| 8 | — | — | — | — | — | — | — | — |

Table 48 below is the T(1,5) table.

TABLE 48

| Present States | Inputs | | | | | | | |
|---|---|---|---|---|---|---|---|---|
| | 000 | 001 | 011 | 010 | 110 | 111 | 101 | 100 |
| 1 | 1 | 0 | 1 | 1 | 0 | 1 | 0 | 0 |
| 2 | — | — | — | — | — | — | — | — |
| 3 | — | — | — | — | — | — | — | — |
| 4 | — | — | — | — | — | — | — | — |
| 5 | 0 | 0 | 1 | 1 | 0 | 0 | 1 | 1 |
| 6 | — | — | — | — | — | — | — | — |
| 7 | — | — | — | — | — | — | — | — |
| 8 | — | — | — | — | — | — | — | — |

Table 49 below is T(-) table:

TABLE 49

| Present States | Input | | | | | | | |
|---|---|---|---|---|---|---|---|---|
| | 000 | 001 | 011 | 010 | 110 | 111 | 101 | 100 |
| 1 | — | — | — | — | — | — | — | — |
| 2 | — | — | — | — | — | — | — | — |
| 3 | — | — | — | — | — | — | — | — |
| 4 | — | — | — | — | — | — | — | — |
| 5 | — | — | — | — | — | — | — | — |
| 6 | — | — | — | — | — | — | — | — |
| 7 | — | — | — | — | — | — | — | — |
| 8 | — | — | — | — | — | — | — | — |

Each table is encoded in the logic function by 11 input variables: 3 for the inputs of the machine and 8 for a one-hot encoding of each state. Combined with the 4 variables of the Karnaugh map, which consist of two partial codes, this results in a 15 variable function which has to be minimised. It should be noted that by setting all off-diagonal tables to T(-), i.e. a table filled with only "don't cares", no adjacency constraints are imposed at all, so any states can occur with any other state in a single term of the minimised function.

Table 50 below shows some terms of the logic function:

TABLE 50

| Input Adjacency relation | Input Machine inputs | Input One hot encoded state | Output |
|---|---|---|---|
| 0000 | 000 | 10000000 | — |
| 0000 | 000 | 01000000 | — |
| 0000 | 000 | 00100000 | — |
| 0000 | 000 | 00010000 | 1 |
| . | . | . | . |
| . | . | . | . |
| 1010 | 100 | 10000000 | 0 |
| . | . | . | . |
| . | . | . | . |
| 1010 | 100 | 00001000 | 1 |

When Table 50 is minimised, Table 51 below is arrived at:

TABLE 51

| Input Adjacency relation | Input Machine inputs | Input One hot encoded state | Output |
|---|---|---|---|
| ---- | 100 | -1------ | 1 |
| ---- | 101 | ------1- | 1 |
| ---- | -11 | ----000- | 1 |
| ---- | 10- | 0000--0- | 1 |
| ---- | 0-0 | -0--00-- | 1 |
| ---- | 01- | -------- | 1 |

This minimised function can be expressed as Table 52 below:

TABLE 52

| Input | State set | Output |
|---|---|---|
| 100 | 2 | 1 |
| 101 | 7 | 1 |
| -11 | 1, 2, 3, 4, 8 | 1 |
| 10- | 5, 6, 8 | 1 |
| 0-0 | 1, 3, 4, 7, 8 | 1 |
| 01- | 1, . . . , 8 | 1 |

This means that it requires at least 6 terms to implement this feedback output, taking into account the imposed adjacency constraints. Since no such constraints were imposed, it is known that the actual number of terms needed in the implementation of the circuit for this feedback output must be at least 6.

It should be noted that the set 1,2,3,4,8 intersects the sets 2,3 and 4,8 non-trivially and it is known that no state from the set 2,3 can ever be adjacent to any state from the set 4,8 no matter how the last co-ordinate is chosen Thus -11 {1,2,3,4,8} can never be represented by a single term in the final solution. (It should be noted that 8 is a "don't care" state and so in columns -11 the output for state 8 could be set to zero, resulting in -11 {1,2,3,4}. However, the set 1,2,3,4 still intersects the sets 2,3 and 4,8 non-trivially, so this term still can not be represented by a single term in the final solution.)

To arrive at a more accurate estimate of the cost for this output, which takes this adjacency constraint into account, the constructed function can be used with more restrictive adjacency constraints by changing the off-diagonal tables. In the four positions 00111 0110, 1100 and 1001 the off-diagonal tables are set to 0. This completely captures the constraints that no state from the set {4,8} can ever be adjacent to a state from the set {2,3} and that no state from the set {6,7} can be adjacent to a state from the set {1,5}. The constructed function then takes the form as given in Table 53 below:

TABLE 53

|    | 00     | 01     | 11     | 10     |
|----|--------|--------|--------|--------|
| 00 | T(4,8) | T(-)   | T(0)   | T(-)   |
| 01 | T(-)   | T(6,7) | T(-)   | T(0)   |
| 11 | T(0)   | T(-)   | T(2,3) | T(-)   |
| 10 | T(-)   | T(0)   | T(-)   | T(1,5) |

Minimisation of the resulting logic function yields Table 54 below:

TABLE 54

| Input Adjacency relation | Input Machine inputs | Input One hot encoded state | Output |
|---|---|---|---|
| -0-0 | 10- | ----1--- | 1 |
| -0-0 | 01- | -------- | 1 |
| 0-01 | 101 | -------- | 1 |
| -111 | -11 | -------- | 1 |
| -1-1 | 100 | --0---0- | 1 |
| -0-0 | -0- | ----0--- | 1 |
| -0-0 | -11 | ----0--- | 1 |
| -1-1 | 0-0 | -0---0-- | 1 |
| -1-1 | 01- | -------- | 1 |

This minimised function can be interpreted as Table 55 below:

TABLE 55

| Input | State set | Output |
|---|---|---|
| 10- | 5 | 1 |
| 01- | 1, 4, 5, 8 | 1 |
| 101 | 6, 7 | 1 |
| -11 | 2, 3 | 1 |
| 100 | 2, 6 | 1 |
| -0- | 1, 4, 8 | 1 |
| -11 | 1, 4, 8 | 1 |
| 0-0 | 3, 7 | 1 |
| 01- | 2, 3, 6, 7 | 1 |

This contains 9 terms. It should be noted that no set: now violates the constraints that no state from the set {4,8} can ever be adjacent to a state from the set {2,3} and that no state from the set {6,7} can be adjacent to a state from the set {1,5}.

It should be noted however, that the constraints imposed by the constructed function can be considered too strict. It has already been noted that 00, 11, 01 and 10 together do lie in the adjacent block -- on a Karnaugh map, and so the set of all the states {1,2,3,4,5,6,7,8} is an adjacent set. However, introducing the non-adjacency constraints, that no state from the set {4,8} can ever be adjacent to a state from the set {2,3} and that no state from the set {6,7} can be adjacent to a state from {1,5}, by this method prevents the adjacency block {1,2,3,4,5,6,7,8} from appearing in one term of the minimised function. This implies that the method as described above can result in an estimate which is worse than the true value. In the example the division which assigns 1 to 1, 2, 4, 6 and 0 to 3, 5, 7, 8 and it can be seen from the above minimised function that this results in at most 8 terms. Every adjacency constraint on sets in the above function is then satisfied and we can gather the terms 01-{1,4,5,8} and 01-{2,3,6,7} to form the term 01-1{,2,3, 4,5,6,7,8}. The adjacency on the latter set is automatically satisfied.

It can now be noted that 01-{1,2,3,4,5,6,7,8} did not appear as a term when no adjacency constraints were imposed. To improve the estimate of the minimum costs the following strategy can therefore be applied. First, the function with no constraints can be constructed. From the minimised representation all terms are picked that contain all states. It is known that the adjacency constraints for this set of states are always satisfied. It is also known that because this term has appeared in the minimum representation, it is very likely to appear in the minimum representation for the complete assignment. To preserve this term in the estimate of the minimum cost, it is now accepted as a term in the estimated minimum representation. This block is replaced in the output function by "don't cares". The adjacency constraints are introduced and the resulting function is minimised. This term will then not show up again but the term has to be added to the obtained minimal representation to cover the original output function. It should be noted that in this way the block is covered by one term instead of two.

If this is applied to the example, having identified the term 01-{1,2,3,4,5,6,7,8} in the minimised function without any constraints, a modified output function is constructed with a block 01-{1,2,3,4,5,6,7,8} replaced with "-don't cares". This results in Table 56 below:

TABLE 56

| Present States | Input | | | | | | | |
|---|---|---|---|---|---|---|---|---|
|   | 000 | 001 | 011 | 010 | 110 | 111 | 101 | 100 |
| 1 | 1 | 0 | — | — | 0 | 1 | 0 | 0 |
| 2 | 0 | 0 | — | — | 0 | 1 | 0 | 1 |
| 3 | 1 | 0 | — | — | 0 | 1 | 0 | 0 |
| 4 | 1 | 0 | — | — | 0 | 1 | 0 | 0 |
| 5 | 0 | 0 | — | — | 0 | 0 | 1 | 1 |
| 6 | 0 | 0 | — | — | 0 | 0 | 1 | 1 |
| 7 | 1 | 0 | — | — | 0 | 0 | 1 | 0 |
| 8 | — | — | — | — | — | — | — | — |

When the constrained function is constructed and minimising as before Table 57 below is arrived at:

TABLE 57

| Input | State set | Output |
|---|---|---|
| 10- | 5 | 1 |
| 101 | 6, 7 | 1 |
| -11 | 2, 3 | 1 |
| 100 | 2, 6 | 1 |
| -0- | 1, 4, 8 | 1 |
| -11 | 1, 4, 8 | 1 |
| 0-0 | 3, 7 | 1 |

If the removed term is added onto this Table 57, Table 58 below results:

TABLE 58

| Input | State set | Output |
|---|---|---|
| 10- | 5 | 1 |
| 101 | 6, 7 | 1 |
| -11 | 2, 3 | 1 |

TABLE 58-continued

| Input | State set | Output |
|---|---|---|
| 100 | 2, 6 | 1 |
| -0- | 1, 4, 8 | 1 |
| -11 | 1, 4, 8 | 1 |
| 0-0 | 3, 7 | 1 |
| 01- | {1, ..., 8} | 1 |

Thus the current estimated minimum is 8 terms.

If there were 3 binary encodings and there were any terms with four associated states, any terms with 8 states and with 4 states would be kept once the adjacency constraints due to the first two binary encodings have been introduced. Next the output function would be modified by replacing the kept blocks with "don't cares" and introducing the constraints due to the 3 binary encodings. Finally, this resulting function will be minimised and the kept terms added back in to arrive at the estimate.

Figure 8:
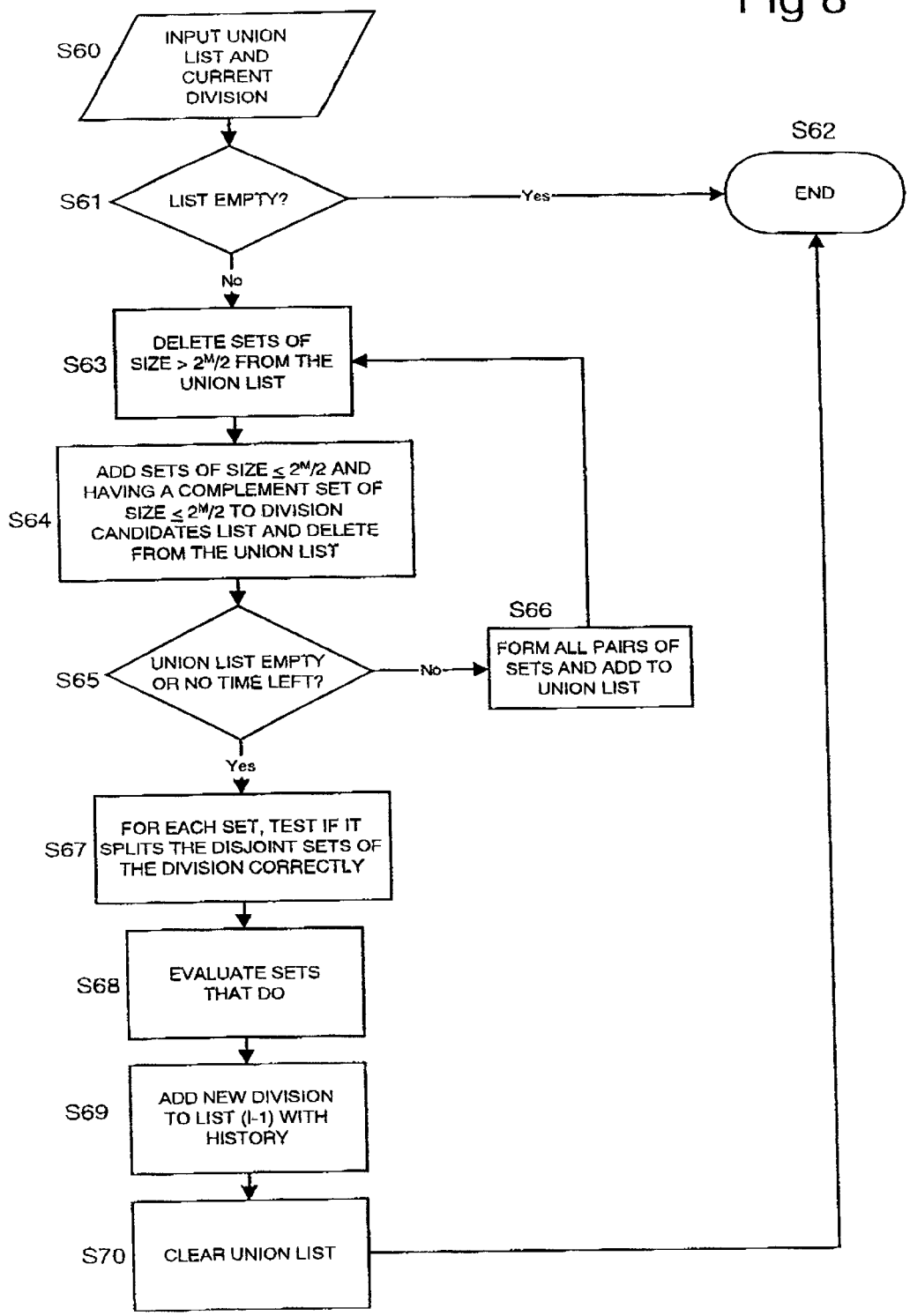
FIG. 8 is a flow diagram illustrating the step of processing the union list in FIG. 5 in more detail.

The method of processing the union list (step S10 of FIG. 5) will now be described in more detail with reference to the flow diagram of FIG. 8.

In step S60 the union list and current division is input. If union lists is empty (step S61) the process terminates in step S62. If the union list is not empty, sets of size greater than $2^m/2$ are deleted from: the union list (step S63). Any sets which are smaller than or equal to $2^m/2$ and which have a complement set of size less than or equal to $2^m/2$ are added to the division candidate list and deleted from the union list in step S64. In step S65 it is then determined whether the union list is empty or the processing time has been completed. If not, in step S66 all pairs of sets are formed and added to the union list. The process then returns to step S63.

If the union list is empty all of the processing time has run out, in step S67 each set is tested to see if it splits the disjoint sets of the current division correctly. Those sets that do are evaluated in step S68 and added to the new division list with the division history in step S69. In step S70 the union list is then cleared and the process terminates in step S62.

Thus in this process sets which are not of the required size can be unioned with other sets which are not of the required size in order to try to obtain sets of the required size to be used as divisions. When a anion of sets results in a set which is too large, this is deleted from the union list (step S63).

The process for ordering virtual finite state machines (step S14) of FIG. 5 will now be described in more detail with reference to the flow diagram of FIG. 9.

In step S80 the list of virtual finite state machines is input. The virtual FSM with the least number of next states not in the present state list is selected and placed at the head of the queue in step S81. The selected virtual finite state machine is then combined with each other virtual finite state machine which is adjacent to the selected finite state machine in step S82. The combination with the least number of next states not in the present state list is then picked for combination in step S83. In step S84 the virtual FSM is placed in the next position in the queue. In step S85 it is then determined whether there are any finite state machines left to be processed. If not the process terminates in step S87. If there are virtual finite state machines left to be processed, in step S86 the picked combination is combined with each adjacent virtual finite state machine not yet placed in a queue and the process returns to step S83.

Thus the result of this process is an ordered list of virtual finite state machines with partially encoded states and having 3 binary encodings left to be determined.

An alternative method of ranking is to order the virtual machines by their partial code in the order given by gray encoding.

Figure 10:
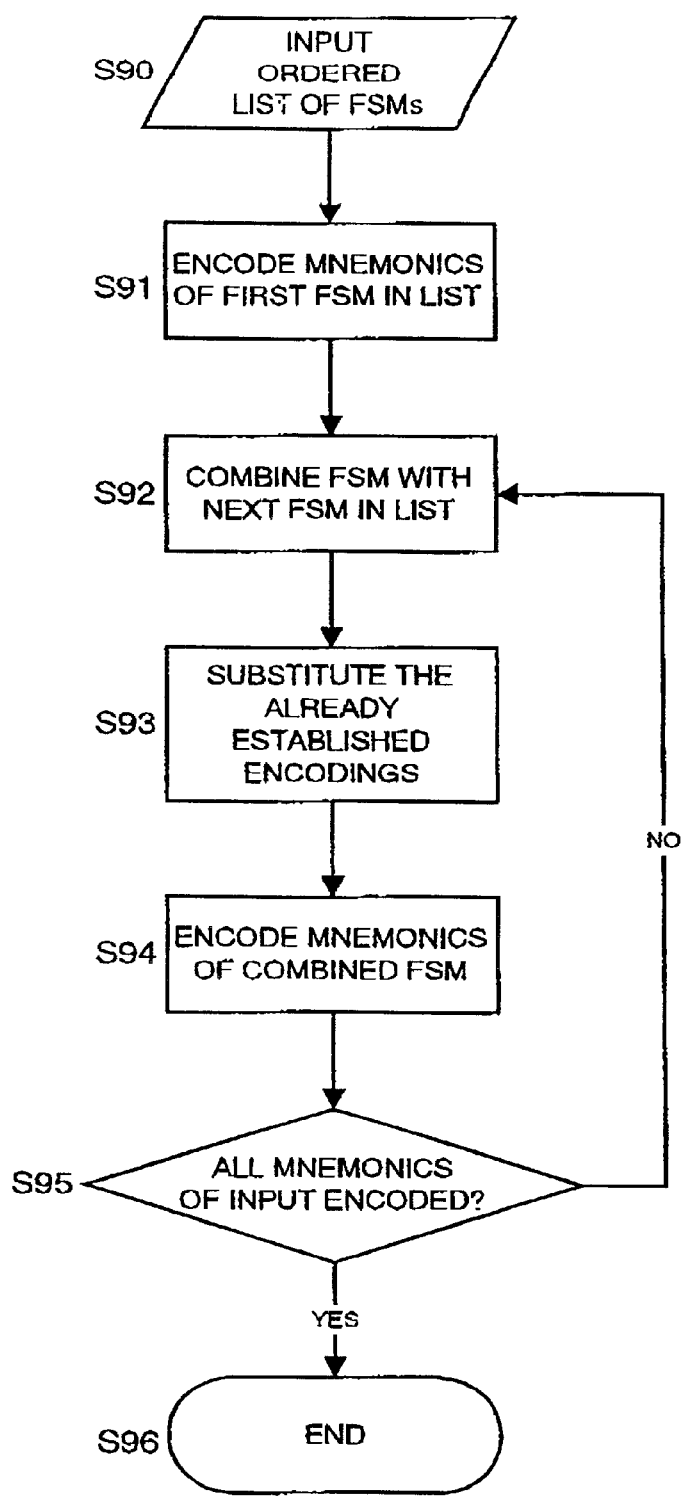
FIG. 10 is a flow diagram illustrating the step of encoding the virtual finite state machines of FIG. 5 in more detail.

The step of encoding the 3 final bits will now be described (step S15 of FIG. 5) with reference to the flow diagram of FIG. 10.

In step S90 the ordered list of finite state machines is input. The mnemonics of the first finite machine in the list are encoded in step S91. The unused partial codes are set to "don't cares" and the partial codes associated with virtual FSMs still in the queue are treated as zero. The encoded finite state machine is then combined with the next finite state machine and the list in step S92 The already established encodings are then substituted in the combined finite state machines step S93 and in step S94 the mnemonics of the combined finite state machine are encoded. Also in step S94 the unused partial codes are set to "don't cares". In step S95 it is then determined whether all of the mnemonics of the input have been encoded. If so the process terminates in step S96 otherwise the process returns to step S92.

Thus this technique results in the exact encoding of the virtual finite state machines sequentially in accordance with the order and in dependence upon the previously encoded virtual finite state machines.

In the first embodiment of the, present invention described hereinabove, logic saving is looked for by looking for next states which transit from all present states i.e. by inspecting columns. The present invention is however applicable to the use of partial columns i.e. looking for a set of present states which is less than all of the present states which transit to a set of next states of reduced size (for minimal length encoding of half size) for an input.

Thus, in Table 3, it is possible to restrict the search to, for example, the top half of the table i.e. for present states 1 to 4. This can allow the identification of useful divisions which can result in logic saving since logical adjacency can be provided by a combination of logical adjacency of the inputs and a logical adjacency for a number (but not all) of the present states.

A second embodiment of the present invention will now be described with reference to FIG. 11.

The first embodiment of the present invention, as described with reference to FIG. 5, utilises a breadth first search technique for minimal length encoding. The second embodiment of the present invention utilises a depth first or "greedy" search. In this technique, a single branch of the tree (see FIG. 4) is followed in order to determine an optimum encoding.

This process will now be described in more detail with reference to the flow diagram of FIG. 11.

In step S100 the state transition data of the finite state machine is input. In step S101 it is determined whether the number of states is less than or equal to p, where p is the number of states to be encoded exactly. If the number of states is less than or equal to p, the p encodings are evaluated exactly in step S102 and the process terminates in step S103.

If in step S101 it is determined that the number of states is not less than or equal to p, in step S104 the first collection of divisions is determined as hereinabove described. A binary encoding is then assigned to each division for the first embodiment in step S105 and in step S106 the cost of each division is estimated as described for the first embodiment. The divisions are then ranked in order of least cost in step S107. In step S108 the division with the least cost is picked and disjoint sets are formed. In step S109 it is then determined whether the number of states in each division is less than or equal to p. If not, in step S110 the modified machine is formed with the divisions thus far determined. In step S111 new divisions are determined for the modified machine and if no divisions are found a division is generated which splits all the largest disjoint sets. The process then returns to step S105 to assign binary encodings to each division.

If in step S109 the number of states in each division is less than or equal to p, in step S112 virtual finite state machines are formed and ordered. Then in step S113 the virtual finite state machines are encoded subject to the ordering as described hereinabove for the first embodiment. In step S114 the encodings and circuit statistics are then stored and in step S103 the process terminates.

Although the first and second embodiments of the present invention have been described as processes for minimal length encoding, the present invention is not limited to minimal length encoding. Minimal length encoding will minimise the number of flip-flops. This may not necessarily result in the fastest and/or smallest circuit. For some circuit implementations, non minimal length encoding is preferred. For example, in field programmable gate arrays, there are usually spare flip-flops available. Thus there is nothing to be gained by minimal length encoding and in fact by using more of the available logic a degree of parallism is obtained thus resulting in a faster logic circuit design.

For non minimal length encoding, it is only necessary to identify a set of next states which is of reduced size compared to the set of present states. Thus it is possible for an eight state machine to require 8 bits to encode it, since the division used to determine the encoding of the bit can result in the division of the present state set of size one less than previous divisions with a compliment set of just 1. Although non-minimal length encoding will require more flip flops, for certain circuit implementations, this can result in faster circuits which may be preferable for certain applications. It is clear from this that the encoding of logic circuits would depend upon the target of the designer. The present invention can take into account such requirements by a designer. For example, where a designer wishes to ensure that minimal flip flops are used, minimal length encoding can be used, whereas where a designer wishes to ensure that optimal speed is achieved and the restriction on the amount of logic is relaxed, non minimal length encoding can be used in order to find useful divisions which will provide optimum encoding to suit the designers requirements.

A third embodiment of the present invention will now be described with reference to FIGS. 12 and 13 which utilizes a breadth first search technique for non-minimal length encoding.

In this technique once a series of divisions have generated disjoint sets which are sufficiently small to be exhaustively evaluated, the disjoint sets are stored in a list (LF) and are not further processed. The list (LF) contains a list of all of the disjoint sets resulting from divisions. These can then be exhaustively evaluated.

Since in non-minimal length encoding there is no requirement to exactly split the sets in half, there is no need for the process of unioning sets. All that is required of the division is that it reduces the set size.

Figure 12:
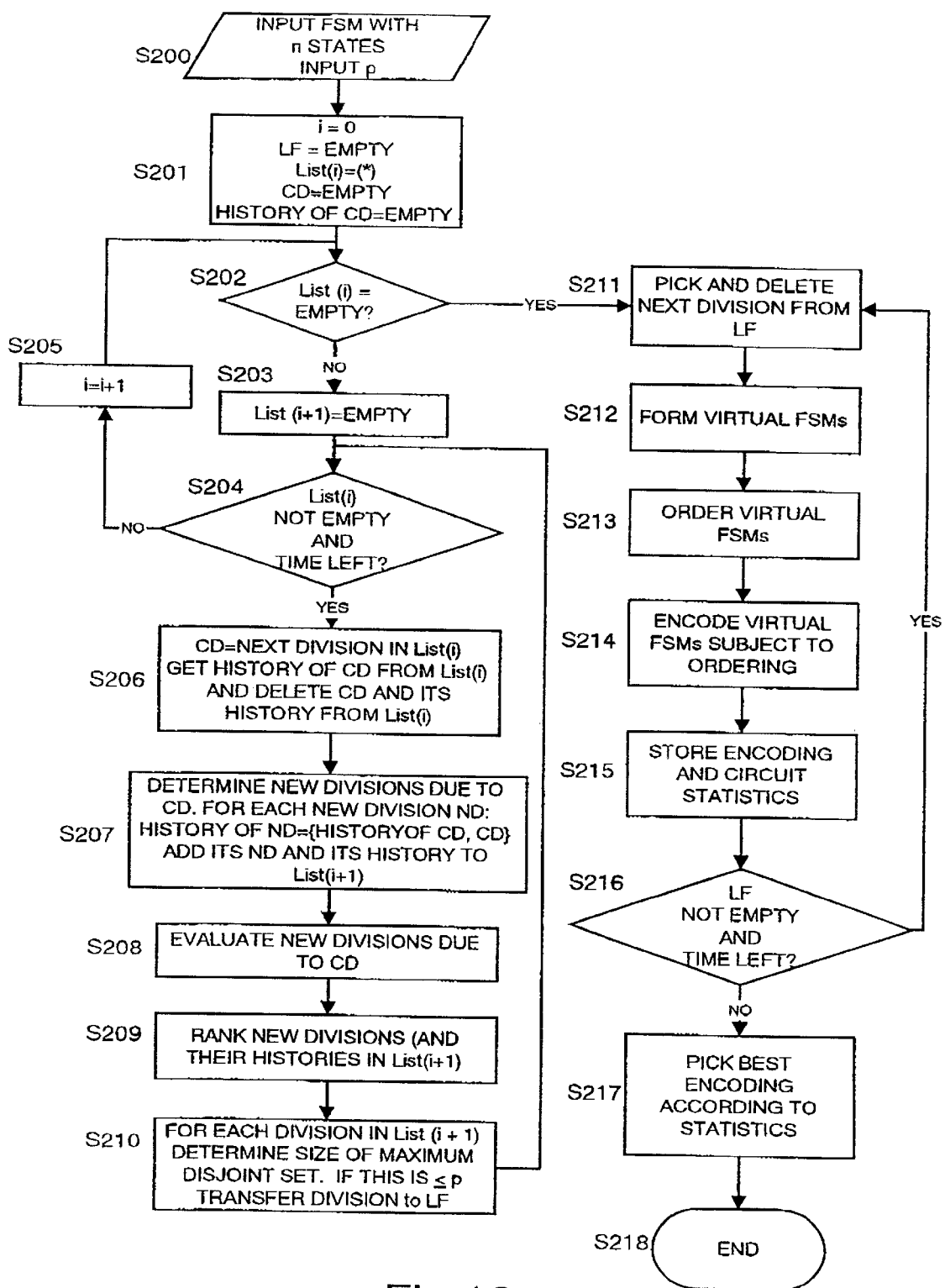
FIG. 12 is a flow diagram illustrating the process of non-minimal length state assignment for a finite state machine in accordance with a third embodiment of the present invention.
Figure 13:
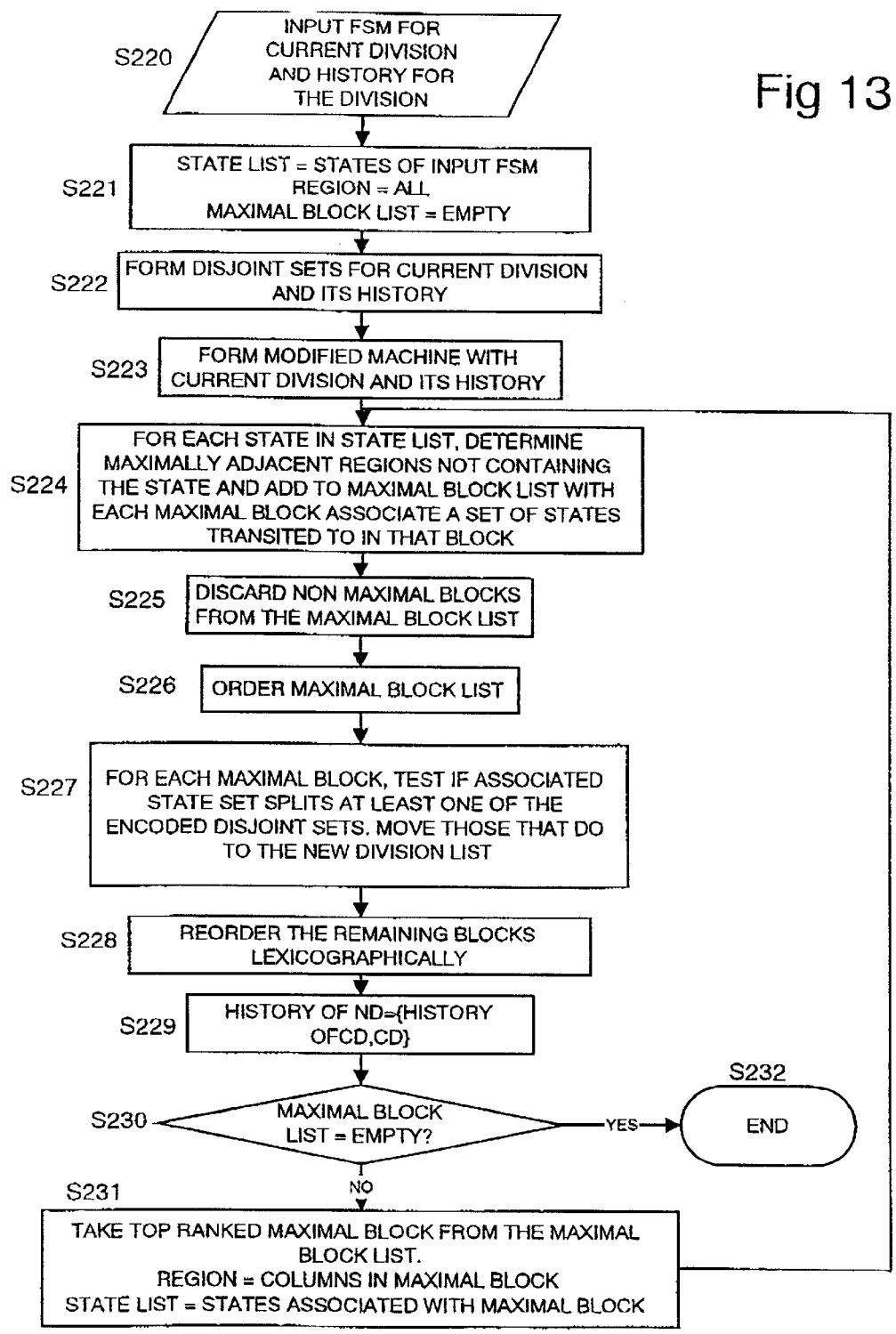
FIG. 13 is a flow diagram illustrating the step of determining new divisions in FIG. 12 in more detail.

Referring now specifically to FIG. 12, in step S200 the finite state machine (FSM) is input with n states. Also input with the FSM is the number p of states for virtual FSM's which can be exhaustively evaluated. This number p is used to halt the divisions when the disjoint sets become small enough to allow exhaustive evaluation.

In step S201, the counter (i) is set to zero and the list (LF) is set to empty. Also the working list (List (i)) is set to a default value (*) Also the current division (CD) is defined as empty and the history of the current division is also set as being empty.

In step S202 it is determined whether the working list (List (i)) is empty. If so, all of the divisions have been processed or the time allowed for processing has expired. Assuming that List (i) is not empty, in step S203 the next list, List (i+1) is set to empty. In step S204 it is then determined whether the current list, List (i) is not empty and processing time is left. If not, in step S205 the counter (i) is incremented and the process returns to step S202. Assuming that the list is not empty, in step S206 the current division (CD) is set to the next division in the list of the current encoding The history of the current division is also obtained from the list of the current encoding, and the current division and the history for the current division are deleted from the list for the current bit encoding. On the first pass through the flow diagram, List (i) is not empty and thus in step S204 the process proceeds to step S206, but in step S206 there are no divisions in List (i).

In step S207 the process determines new divisions (ND) and for each new division the history equals the history of the current division with reference to the current division The new divisions (ND) and their histories are added to the next list, List (i+1) for the next bit encoding. The new divisions are then evaluated in step S208. In step S209 the new divisions (ND) and their histories are ranked in the list for the next encoding, List (i+1). In step S210 for each division in the list for the next encoding, List (i+1) the size of the maximum disjoint set is determined and if this is less than or equal to p, the division is transferred to the list LF. In this way, any divisions which have resulted in disjoint sets which can be exhaustively evaluated i.e. they have a number of sets which is less than or equal to p, these are removed from the list for further processing and replaced in the final list LF for exhaustive evaluation. The process then returns to step S204 to continue divisions until either the complete tree structure is evaluated or processing time is exhausted.

Once all of the tree structure has been evaluated, i.e. all divisions have been evaluated, or processing time has been exhausted, in step S202 it is determined that the current list List (i) is empty and the process proceeds to step S211 to pick and delete the next division from the list LF. Virtual finite state machines are formed for the division in step S212 and in step S213 the virtual finite state machines are ordered. The virtual finite state machines are then encoded subject to the ordering in step S214 and encoding and circuit statistics for the encoding are then stored in step S215. In step S216 it is determined whether all of the divisions have been processed or the processing time has expired. If the processing time has not expired, and there are still more divisions left to be processed, the. process returns to step S211. If the processing time has expired or there are no more divisions left to be processed, in step S217 the best encodings are selected according to the stored statistics. The process then terminates in step 5218.

The process of determining the new divisions (step S207 of FIG. 12) will now be described in more detail with reference to the flow diagram of FIG. 13.

In step S220 the finite state data for the current division and history for the current division are input. In step S221 the state list is set to the states of the input FSM data. The region to be searched is set to all as a default. A maximal block list is initially set as empty.

In step S222 disjoint sets for the current division and its history are formed. For the first pass through the flow diagram of FIG. 12, no divisions have yet been determined and thus there are no disjoint sets to be formed.

In step S223 a modified machine is formed with the current division and its history. Once again in the first pass through the flow diagram, there is no modified machine to be formed since no divisions have been determined. Thus, the machine formed comprises the full finite state machine.

Then for each state in the state list a maximally adjacent region not containing the state is determined and added to the maximal block list in step S224. Also a set of states transited to in each block is formed for each respective maximal block. In step S225, non-maximal blocks are discarded from the maximal block list. In step S226 each maximal block is tested to see if the associated state sets splits at least one of the encoded disjoint sets. Those that do are moved to the new division list. In step S227 the remaining blocks are then reordered lexicographically. This process of reordering comprises firstly ordering the blocks on the basis of the maximum width of the block. Those blocks of the same block size are then ordered in the order of the blocks having the smallest maximum encoded disjoint set size. Those blocks which are of the same width and have the same maximum encoded disjoint set size, these blocks are further ordered to give priority to blocks which have the smallest number of states.

The first criterion for ordering gives importance to divisions which are likely to lead to a large logic saving, as identified by their block size. The second criteria for ordering is an attempt to identify divisions which lead to even splitting of the sets i.e. produces disjoint sets more evenly in size. This causes the ordering to give higher preference to divisions which are closest to minimal length encoding divisions. The third criterion for ordering is to identify maximal blocks which contain the least number of states. This minimises the chances of these states occurring in the complement of the block and is therefore likely to lead to a logic saving. In the first embodiment of the present invention, this was the criteria used to identify blocks with the correct number of states suited for minimal length encoding.

This ordering process tends to place divisions which are likely to be good divisions at the top of the list thus ensuring preferential processing.

In step S228 the history of the new divisions is set to the history of the current divisions with reference to the current divisions and in step S229 it is determined whether the maximal block list is empty. If so the process terminates in step S231. If not, in step S230, the top ranked maximal block is taken from the maximal block list, the region is set to the columns in the maximal blocks and the state list is set to the states associates with the maximal block. The process then returns to step S224 for the processing of the states in the maximal block.

In this breadth first search technique for non-minimal length encoding, the process for evaluating the new divisions (step S208 in FIG. 12) is the same as for the first embodiment and is thus described with reference to FIG. 7.

Figure 9:
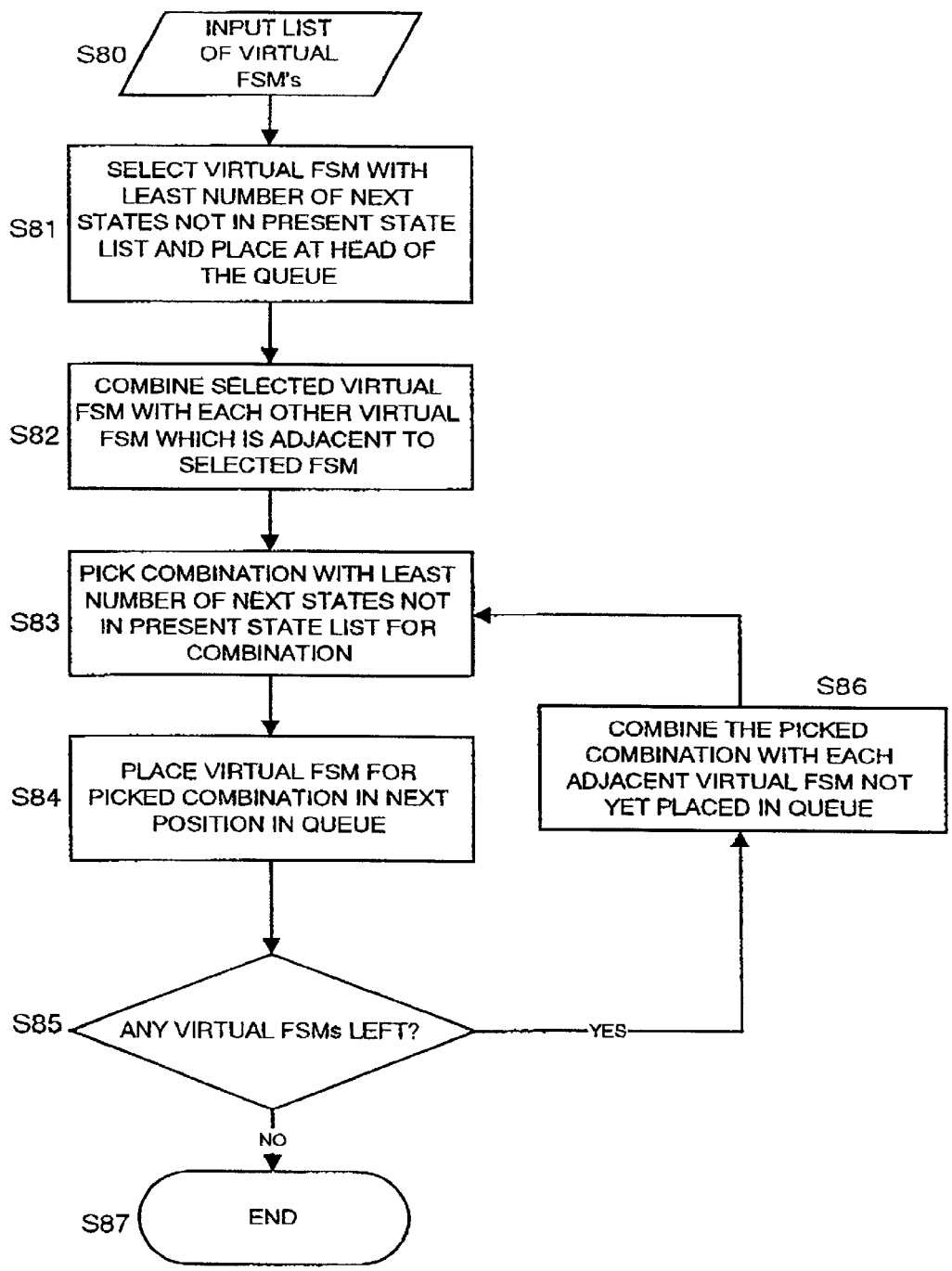
FIG. 9 is a flow diagram illustrating the step of ordering the virtual finite state machines in FIG. 5 in more detail.

The step of ordering the virtual FSM's (step S213 in FIG. 12) is also the same as that described for the first embodiment with reference to FIG. 9. Further, the step of encoding the virtual FSM's subject to ordering (step S214 of FIG. 12) is the same as for the first embodiment and is thus described with reference to FIG. 10.

A fourth embodiment of the present invention will now be described which utilizes a depth first or 'greedy' search technique for non-minimal length encoding. As for the technique of the second embodiment for minimal length encoding, a single branch of the tree is followed in order to determine an optimum encoding.

Figure 11:
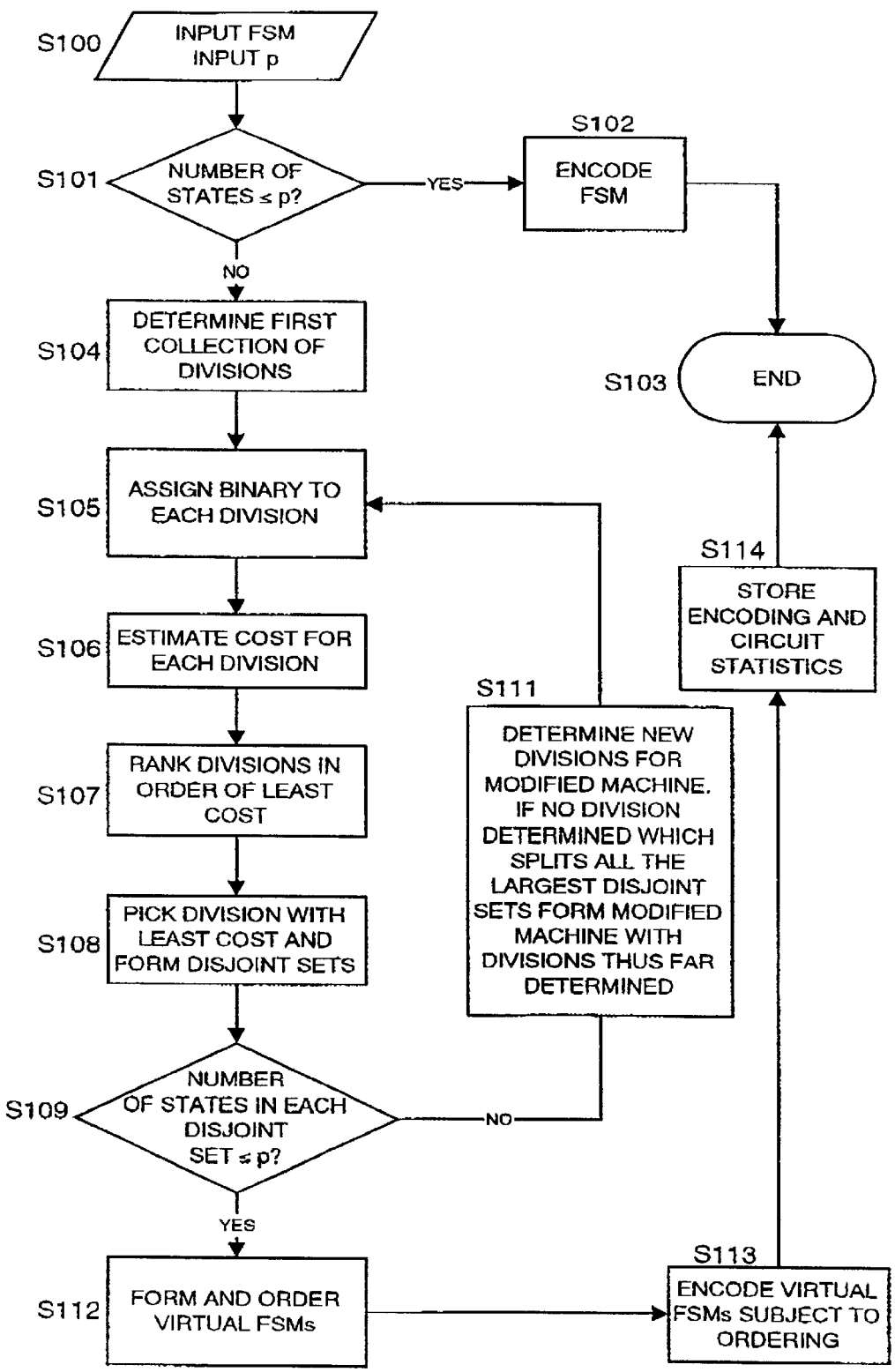
FIG. 11 is a flow diagram illustrating a second embodiment of the present invention.

The depth first non-minimal length encoding technique is identical to the technique disclosed with reference to FIG. 11. The only difference lies in the particular technique used for determining the collection of divisions (steps S104 and S111). This process has been described hereinabove for the third embodiment of the present invention with reference to FIG. 13.

A fifth embodiment of the present invention will now be described with reference to FIGS. 14a, 14b and 14c, 15 and 16 which describe a hybrid breadth/depth first search technique for non-minimal length encoding. This technique is the preferred technique since it does not simply return a single encoding resulting from following a single path as in the depth first search technique, neither does it suffer from the disadvantage of the breadth first search technique which requires all of the branches of the tree to be analysed. In this hybrid technique, the depth first search technique is used to identify a 'best' encoding which represents a leaf in the tree structure. In order to identify further possible 'good' encodings, the search technique returns to the nearest node to the leaf in order to identify a next best leaf (encoding). This process is repeated a predetermined number of times to determine a cluster of solutions. When a cluster is complete the encodings are removed from the search and the process is repeated to determine a number of clusters.

In the technique of the fifth embodiment of the present invention, if, during the repeated determinations to form a cluster, no solution is found i.e. the search reaches a point at which no more division can be found, divisions can be forced in one of two ways. The first technique used to try to force a divisions is to use non-maximal blocks. If this still does not result in any new divisions, a division can be generated that splits all of the largest disjoint sets. The process can then carry on with this forced division. This technique of forcing the division avoids the search terminating with an incomplete encoding. The forcing of a division can allow the search to continue to provide a full encoding.

The use of forcing is essential for example when a permutation machine is to be encoded since right at the start for the first bit encoding no divisions can be found. Following the generation of a forced division, it is often the case that the search technique can complete the encoding.

This embodiment of the present invention will now be described in more detail with reference to FIGS. 14a, 14b and 14c.

In step S140 the finite state machine with n states is input. Also the variable p which indicates the number of states of the virtual FSM's which can be exhaustively evaluated. As in the previous embodiments, this number is used to halt the divisions when the disjoint sets becomes small enough to allow exhaustive evaluation. Also there is input a variable NCR which identifies the number of clusters required to be found. Further, in order to limit the processing time allowed for the determination of each cluster, a variable Max_Iterations is input to limit the number of iterations performed by the algorithm in determining a cluster.

In step S141 a list LF which is to contain divisions to be exhaustively evaluated is set at EMPTY. Also the working list List is set to a default value *. Further, a variable NCF which identifies the number of clusters found is set to zero. A variable cluster_Start_Level which identifies the level at which the algorithm is to start the identification of a cluster is set to level 1. A variable Force_Solution is set to FALSE to indicate that a division is not to be forced until this variable is set to TRUE. A variable which identifies the best node determined so far (Best_Node_Sofar) is also set to a default value *.

In step S142 it is determined whether the number of clusters found is the number of clusters required (NCR) If the number of clusters found is the number of clusters required, the process then proceeds to step S166 to carry out the complete encoding as will be described in more detail hereinafter.

If the number of clusters found is not yet the number of clusters required in step S143 it is determined whether the current working list is EMPTY. If the current working list is EMPTY this indicates that there are no more divisions to be found and thus the process proceed to S166 to determine the encoding. On the first pass through this process, since in step S141 the current working list is set to a default value, it is not EMPTY and thus the process proceeds to S144 where the size of the current cluster (SCC) is reset to zero and the number of iterations are reset to zero. Then in step S145 it is determined whether the size of the current cluster is greater than or equal to the size of the cluster required (SCR). If so this indicates that the number of solutions found is sufficient for a cluster and thus in step S146 all the nodes with the number of bits which are greater than the cluster start level are removed from the list. This has the effect of removing the nodes which were identified in the determination of the cluster. In step S147 the counter for the number of clusters found is then incremented and the process returns to step S142.

If in step S145 it is determined that the size of the current cluster is not the required size, in step S148 it is then determined whether the number of iterations carried out in the determination of the cluster has reached a predetermined maximum value and if so the process proceeds to step S160 in order to determine whether any solutions have been found. If so the process proceeds to step S166 for the encoding of the circuit as will be described in more detail hereinafter. If not, the process proceeds to step S161 to force a division. This will be described in more detail hereinafter.

It in step S148 the number of iterations does not reach the predetermined maximum, in step S149 it is determined whether the current list is EMPTY. If so, there are no more divisions to be processed and thus the process proceeds to step S160. If the list is not EMPTY, in step S150 the first ranked division and its history is removed from the list and set as the current division (CD).

New divisions due to the current division are then determined in step S151 and for each new division (ND) the history of the new division is set as the history of the current division with reference to the current division. Also new divisions and their histories are added to the current list. This process will be described in more details with reference to FIG. 15 hereinafter.

For each new division, the size of the maximum disjoint set is then determined in step S152. If this is less than or equal to p, then the division is transferred to the list LF and the size of the current cluster (SCC) is incremented by 1.

The remaining new divisions are then added and ranked in the current list. The ranking is carried out with regard to the number of bits already encoded for this division (i.e. the size of its history or the depth in the tree), the width of the last block, the size of the largest disjoint set, and the number of associated states. The first criterion is therefore the depth in the tree, which is ordered in descending order (deepest first). Apart from this added first criterion, the ranking process corresponds to the lexicographical ranking used in the previous embodiments and described hereinabove.

If a node corresponding to a division is determined as being a better node, the identification of this node is used to update the Best_Node_Sofar variable in step S154. The Best_Node_Sofar is identified using the following criteria. Every node is better than the default value *. A node is the Best_Node_Sofar if the size of the largest disjoint set is smaller than that of the current best node.

In step S155 it is then determined whether any new divisions have been found. If so, in step S157 the variable Force_Solution is set to FALSE and the number of iterations is incremented in step S158. The process then returns to step S145.

If in step S155 it is determined that no new divisions have been found, in step S156 it is determined whether the Force_Solution variable has been set to TRUE. if not the process proceeds to step S157. If the Force_Solution variable is set to TRUE, this means that no new divisions have been found despite the process having gone through the first level of forcing (step S161 to step S165). Thus in step S159, a division is generated that splits all the largest disjointed sets for the node. A new division is set as the generated division and the history of the new division is set as the history of the current division with reference to the current division. The process then returns to step S152 to try to continue the process using this generated division.

The first level of forcing to determine a division is carried out by step S162 to S165. When the normal division determination process is unable to determine new divisions within the predetermined number of iterations, the Force_Solution variable is set to TRUE in step S161. In step S162 the current list is cleared and then the Best_Node_Sofar is added to the current list. In step S163 the variable Cluster_Start_Level is set to the number of bits of the Best_Node_Sofar plus 1 and the variable Best_Node_Sofar variable is set to a default value. Thus in this way the search space is restricted to the best node and the algorithm will no longer search above this for the determination of nodes of this and subsequent clusters.

In step S164 the current division is determined by taking and removing the first ranked division and its history from the current list i.e. the Best_Node_Sofar. New divisions are then determined in step S165 due to the current division using only non maximal blocks. For each new division ND the history of the new division is then set to the history of the current division with reference to the current division. This process of determine new divisions using non maximal blocks will be described in more detail hereinafter with reference to FIG. 16. The use of non maximal blocks places a relaxation on the restrictions for identifying good divisions, thus allowing the identification of a division even if it is not as good because it does not use maximum blocks. Thus with the determination of new divisions in step S165 the process proceeds to step S152 to resume normal division processing.

Figure 14C:
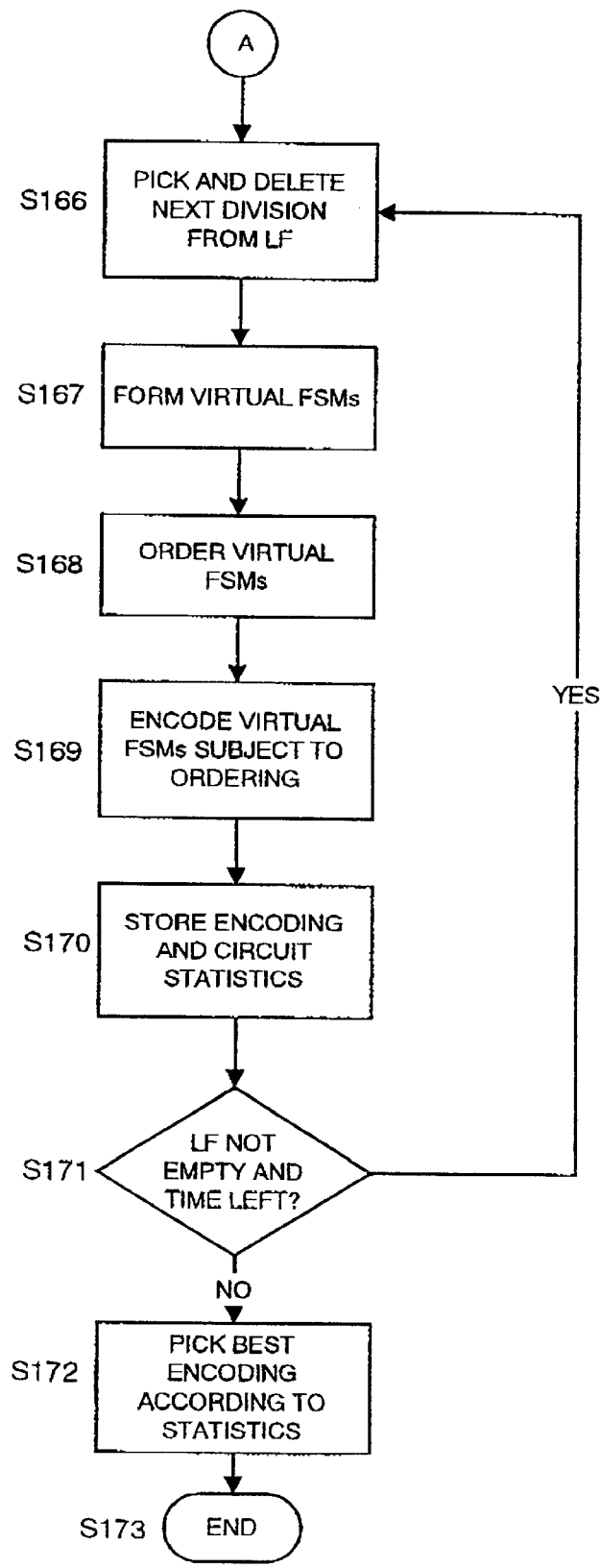

Once the working list is EMPTY, the number of clusters found has reached the desired level, or the number of iterations has reached the predetermined maximum and there are solutions found, the process of encoding the complete circuit is then carried out in step S166 to step S172 as illustrated in FIG. 14c.

In step S166 the next division is picked from the list LF. Virtual finite state machines are formed for the division in step S167 and in step S168 the virtual finite state machines are ordered. The virtual finite state machines are then encoded subject to the ordering in step S169 and the encoding and circuit statistics for the encoding are then stored in step S170. In step S171 it is determined whether all of the divisions have been processed or the processing time has expired. If the processing time has not expired and there are still more divisions left to be processed, the process returns to step S166. If the processing time has expired or there are no more divisions left to be processed, in step S172 the best encodings are selected according to the stored statistics. The process then terminates in step S173.

It can thus be seen from FIGS. 14a, b and c, that divisions can be determined in three different ways:

(a) normally using maximal blocks,
(b) by the first forcing step using non-maximal blocks if (a) does not provide divisions, and
(c) by the second forcing step of simply generating a division that splits all of the largest disjoint sets if neither (a) or (b) provide divisions.

The process of determining the new divisions (step S151 of FIG. 14a) will now be described in more detail with reference to FIG. 15.

In step S174 the finite state machine for the current division and its history are input. In step S175 the maximal block list and the new division list are set as BOY. In step S222 disjoint sets for the current division and its history are formed. In step S177 a modified machine is formed with the current division and its history. Then, for each state of the machine maximally adjacent regions not containing the state are determined and added to the maximal block list in step S178. In step S179 non maximal blocks are discarded from the maximal block list and in step S180 with each maximal block a set of states transited to in that block is associated. The maximal block list is then ordered in step S181 as described hereinabove for previous embodiments, and in step S182 blocks with identical state sets are removed keeping the first block in the order. In step S183 each maximal block is tested to see if the associated state set splits at least one of the encoded disjoint sets. Those that do are added to the new division list and those that do not are discarded. The process then terminates in step S184.

The process of determining new divisions using non maximal blocks (step S165, FIG. 14b) will now be described in more detail with reference to the flow diagram of FIG. 16. This process is identical to the process of FIG. 15 except that non maximal rather than maximal blocks are used.

In step S185 the finite state machine for the current division and its history are input. In step S186 the non-maximal block list and the new division list are set as EMPTY. In step S222 disjoint sets for the current division and its history are formed. In step S188 a modified machine is formed with the current division and its history. Then, for each state of the machine maximally adjacent regions not containing the state are determined and added to the non-maximal block list in step S189. In step S190 maximal blocks are discarded from the non-maximal block list and in step S191 with each non-maximal block a set of states transited to in that block is associated. The non-maximal block list is then ordered in step S192 as described hereinabove for previous embodiments, and in step S193 blocks with identical state sets are removed keeping the first block in the order. In step S194 each non-maximal block is tested to see if the associated state set splits at least one of the encoded disjoint sets. Those that do are added to the new division list and those that do not are discarded. This process then terminates in step S195.

A sixth embodiment of the present invention will now be described with reference to FIG. 17.

This embodiment of the present invention utilises the technique as described hereinabove for the first to fifth embodiments to optimise the encoding already assigned to a logic circuit. Using this technique of this embodiment of the present invention, one or more symbolic representations can be assigned to any number of binary encoded bits of a binary encoded state representation. The assigned symbolic representation or representations, can then be binary encoded using the techniques of any of the first to fifth embodiments described hereinabove.

For example, the 3 bit encoded state representation can be symbolically encoded as illustrated below:

| | | |
|---|---|---|
| 000 | | 0 a |
| 001 | | 0 b |
| 011 | | 0 c |
| 010 | → | 0 d |
| 110 | | 1 d |
| 111 | | 1 c |
| 101 | | 1 b |
| 100 | | 1 a |

In this example the symbolic representations a,b,c, and d can then be encoded using the techniques described hereinabove for using any conventional exact evaluation technique.

The binary encoded state representation can be symbolically encoded with more than one symbolic code as illustrated below:

| | | | | |
|---|---|---|---|---|
| 0 0 0 0 0 | | $a_1$ | 0 | $a_2$ |
| 0 0 0 0 1 | | $a_1$ | 0 | $b_2$ |
| 0 0 0 1 1 | | $a_1$ | 0 | $c_2$ |
| ... | | . | . | |
| ... | | . | . | |
| ... | | . | . | |
| 0 1 0 0 0 | | $b_1$ | 0 | $a_2$ |
| 1 1 0 0 0 | → | $c_1$ | 0 | $a_2$ |
| ... | | . | . | |
| ... | | . | . | |
| ... | | . | . | |
| 0 0 1 0 0 | | $a_1$ | 0 | $a_2$ |
| 0 0 1 0 1 | | $a_1$ | 0 | $b_2$ |
| 0 1 1 0 0 | | $b_1$ | 0 | $a_2$ |
| . | | . | | |
| . | | . | | |
| . | | . | | |

In this example the symbolic representations $a_1, b_1, c_1$ and d, can be evaluated separately to the symbolic representations $a_2$, $b_2$, $c_2$ and $d_2$.

The specific technique utilising the technique of embodiment 1 or embodiment 2 will now be described with reference to FIG. 17.

In step S120 the KISS file with binary encodings for the states is input. In step S121 the state encodings are broken into n parts. For at least one part for each state the binary is encoded as a mnemonic in step S122. In step S123 it is then determined whether there is more than one part encoded. If not, in step S124 it is determined whether a number of different encodings is less than or equal to p. If not, in step S126 the part is encoded and evaluated exactly and the process terminates in step S127. If in step S124 it is determined that the number of different encodings of the part is greater than p, in step S125 the mnemonically encoded part is bit wise encoded until the number of encodings equals p and then the encodings are encoded and evaluated using an exact technique. The process then terminates in step S127.

If in step S123 it is determined that more than one part is encoded, in step S128 one of the parts is chosen and in step S129 it is determined whether the number of different encodings of the chosen part is less than or equal to p. If so, in step S130 the chosen part is encoded and evaluated using an exact technique and the process proceed to step S132 to chose the next part. If in step S129 it is determined that the number of different encodings for the part is greater than p in step S131 the mnemonically encoded part is bit wise encoded until the number of encodings is equal to p. The p encodings are then encoded and evaluated exactly and then the process proceeds to step S136 to determine if there are any parts left to be encoded. If so in step S132 the next part is chosen.

For the next part in step S133 it is determined whether the number of different encodings of the part is then or equal to p. If not, in step S134 the chosen next part is encoded in combination with each encoding of the previous part or parts and the process proceeds to step S136 to determine whether there are any parts left to be encoded. If in step S133 it is determined that the number of different encodings is greater than or equal to p, in step S135 the mnemonically encoded part is bit wise encoded in combination with each encoding of previous part or parts until the number of encodings is equal to p. Then the p encodings are encoded and evaluated exactly and the process proceeds to step S136 to determine whether there are any parts left to be encoded. If in step S136 it is determined that there are parts left to be encoded, the process returns to step S132 to chose the next part. If in step S136 it is determined that there are no parts left to be encoded, the process terminates in step S127.

This embodiment of the present invention thus allows for a previously state assigned circuit to be tested to determine an optimum binary encoding by only symbolically encoding part of the binary code and optimising that part.

This aspect of the present invention is applicable not just to the determination of binary encodings for finite state machines but is applicable to the determination of binary encodings for any form of circuits including combinational circuits and cascaded circuits. The concept lies in the breaking down of the circuit into virtual circuits which are separately state assigned.

The present invention can be implemented on a special purpose machine or more conveniently in a programmed general purpose computer. In the latter case, the present invention can thus also be embodied as a computer program for controlling the general purpose computer to implement the method. The computer program can be provided to the general purpose computer on any carrier medium e.g. a storage medium such as a floppy disk, CDROM, programmable read only memory device, or programmable tape, or a signal carrying the computer program over a network e.g. the Internet.

The result of the binary encoding technique described hereinabove with reference to the embodiments, can then be applied in the construction of a logic circuit using well known techniques of circuit fabrication.

In the present invention, if a division cannot be found which splits the next state set, in order to avoid the technique failing to encode a circuit, a division can be arbitrarily chosen to enable the repeated dividing to be carried on. This technique is particularly useful when applying the invention to permutation machines for example.

The aspects of the present invention described hereinabove can be used either separately or in any combination.

Although the present invention has been described hereinabove with reference to specific embodiments, the present invention is not limited to these embodiments and it will be apparent to a skilled person in the art that modifications lie within the spirit and scope of the present invention.

What is claimed is:

1. A method of state assignment of a logic circuit, the method comprising:

receiving state transition data for the logic circuit the state transition data including internal state representations;

encoding the internal state representations by determining binary code comprising a plurality of bits for said internal state representations one bit at a time until a predetermined number of bits is left to be encoded to provide an encoding of said internal state representations; and exhaustively evaluating possible encodings for the predetermined number of bits left to be encoded having regard to the determined binary code or codes for said internal state representations to determine an optimum state assignment for the logic circuit.

2. The method according to claim 1, wherein said determining step includes, for each encoded bit, determining a cost of outputs of the logic circuit having the internal state representations encoded with the encoded bit, and using the determined cost in the determination of optimum binary code for the encoded bit for said internal state representations.

3. The method according to claim 2, wherein said determination of the cost comprises determining a cost of primary outputs of the logic circuit and any previously encoded bits for said internal state representation forming feedback outputs for the logic circuit.

4. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 3.

5. The method according to claim 2, wherein the cost comprises a number of literals for the outputs and the optimum binary code is determined to minimise the number of literals.

6. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 5.

7. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 2.

8. The method according to claim 1, wherein the step of determining binary code for said internal state representations comprises:

determining binary code for said internal state representations one bit at a time by repeatedly dividing the internal state representations into disjoint sets by reference to next states transited to from present states in response to an input to the logic circuit and assigning a binary code to each bit in dependence upon the divisions;

where the sets of internal state representations become repeatedly smaller after each division, and the divisions of the internal state representations are determined in dependence upon the encoding of any previous divisions.

9. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 8.

10. The method according to claim 1, wherein the step of determining binary code for said internal state representations comprises:

identifying for a first bit at least one set of internal state representations for next states to which a set of internal state representations for present state transit upon an input to the logic circuit, the or each identified set being one of a pair of disjoint sets dividing said internal state representations into two sets;

assigning a binary code to the first bit for each internal state representation dependent upon which set of the pair of disjoint sets the internal state representations belongs to;

for any subsequent bits, subsequently identifying for each previously identified disjoint set for a previous bit, at least one set of internal state representations for next states to which a set of internal state representations for present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and assigning a binary code to any subsequent bit for each said internal state representation dependent upon which set of the or each pair of disjoint sets the internal state representation belongs.

11. The method according to claim 10, wherein the or each set of internal state representations for next state is identified for a plurality of logically adjacent possible inputs.

12. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 11.

13. The method according to claim 10, wherein the or each set of internal state representations is identified to have, for the first bit, half the number of internal state representations rounded up to the nearest power of two, and for any subsequent bits, half the number of internal state representations in the previously identified disjoint sets rounded up to the nearest power of two.

14. The method according to claim 12, wherein internal state representations are added if necessary to the identified sets of internal state representations to make the sets of a required size.

15. A computer system for the state assignment of a logic circuit, the computer system composing:

a program store for storing processor readable and implementable instructions; and a processor for reading and implementing the instructions in the program store;

wherein the instructions stored in the program store comprise instructions for controlling the processor to carry out the method of claim 14.

16. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 12.

17. The method according to claim 10, wherein at least one of the or each set of internal state representations is identified as a small set of internal state representations for next states for each of a plurality of different inputs to the logic circuit, the method including unioning said small sets to form the at least one set of internal state representations.

18. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 17.

19. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 10.

20. The method according to claim 1, wherein each determined binary encoding represents a set of said internal state representations, each set of said internal state representations having said predetermined number of bits left to be encoded, and the exhaustive evaluation step comprising:

(a) determining the set of said internal state representations which has a smallest number of internal state representations for next states transited to upon an input which are not in the set and which require encoding of said predetermined number of bits left to be encoded;

(b) defining default encodings for the predetermined number of bits left to be encoded for any said internal state representations for next states not in the set of internal state representations;

(c) exhaustively evaluating the possible encodings for the predetermined number of bits left to be encoded for said set of internal state representations to determine optimum encodings;

(d) combining said set of internal state representations with each logically adjacent partially encoded set to form a new set of internal state representations; and (e) repeating steps (a) to (d) until said predetermined number of bits left to be encoded for all of said internal state representations have been encoded.

21. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 20.

22. Computer program code for controlling a computer to implement the method of claim 1.

23. A carrier medium carrying the computer program code of claim 22.

24. A method of constructing a logic circuit comprising the method of claim 1, and constructing the logic circuit according to the binary encodings for the internal state representations.

25. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 1.

26. An apparatus for the state assignment of a logic circuit, the apparatus comprising:

receiving means for receiving state transition data for the logic circuit, the state transition data including internal state representations;

determining means for encoding the internal state representations by determining binary code comprising a plurality of bits for said internal state representations one bit at a time until a predetermined number of bits is left to be encoded to provide an encoding of said internal state representations; and evaluation means for exhaustively evaluating all possible encodings for the predetermined number of bits left to be encoded having regard to the determined binary code or codes for said internal state representations to determine an optimum state assignment for the logic circuit.

27. The apparatus according to claim 26, wherein said determining means is adapted to, for each encoded bit, determine a cost of outputs of the logic circuit having the internal state representations encoded with the encoded bit, and to use the determined cost in the determination of optimum binary code for the encoded bit for said internal state representations.

28. The apparatus according to claim 27, wherein said determining means is adapted to determine a cost of primary outputs of the logic circuit and any previously encoded bits for said internal state representation forming feedback outputs for the logic circuit.

29. The apparatus according to claim 27, wherein the cost comprises a number of literals for the outputs and said determining means is adapted to determine the optimum binary code to minimise the number of literals.

30. The apparatus according to claim 26, wherein said determining means is adapted to repeatedly divide the internal state representations into disjoint sets by reference to next states transited to from present states in response to an input to the logic circuit, and to assign a binary code to each bit in dependence upon the divisions, wherein said determining means is adapted to make the sets of internal state representations repeatedly smaller after each division and to determine the divisions of the internal state representations in dependence upon the encoding of any previous divisions.

31. The apparatus according to claim 26, wherein said determining means includes:

identifying means for identifying for a first encoded bit at least one set of internal state representations for next states to which a set of internal state representations for present states transit upon an input to the logic circuit, the or each identified set being one of a pair of disjoint sets dividing said internal state representations into two sets; and assigning means for assigning a binary code to the first bit for each internal state representation dependent upon which set of the pair of disjoint sets the internal state representation belongs to;

wherein said identifying means is adapted, for any subsequent bits and for each previously identified disjoint set, to subsequently identify at least one set of internal state representations for next states to which a set of internal state representations of present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and said assigning means is adapted to assign a binary code to any subsequent bit for each said internal state representation dependent upon which set of the or each pair of disjoint sets the internal state representation belongs.

32. The apparatus according to claim 31, wherein said identifying means is adapted to identify the or each set of internal state representations of next states for a plurality of logically adjacent possible inputs.

33. The apparatus according to claim 31, wherein said identifying means is adapted to identify the or each set of internal state representations to have, for the first bit, half the number of internal state representations rounded up to the nearest power of two, and, for any subsequent bits, half the number of internal state representations in the previously identified disjoint sets rounded up to the nearest power of two.

34. The apparatus according to claim 33, including means for adding internal state representations if necessary to the identified sets of internal state representations to make the sets of a required size.

35. The apparatus according to claim 31, wherein said identifying means is adapted to identify at least one of the or each set of internal state representations as a small set of internal state representations for next states for each of a plurality of different inputs to the logic circuit, the apparatus including unioning means for unioning said small sets to form the at least one set of internal state representations.

36. The apparatus according to claim 26, wherein each determined binary encoding represents a set of said internal state representations, each set of said internal state representations has said predetermined number of bits left to be encoded, said determining means is adapted to:

(a) determine the set of said internal state representations which has a smallest number of internal state representations for next states transited to upon an input which are not in the set and which require encoding of said predetermined number of bits left to be encoded;

(b) define default encodings for the predetermined number of bits left to be encoded of any said internal state representations for next states not in the set of internal state representations;

(c) exhaustively evaluate the possible encodings for the predetermined number of bits left to be encoded for said set of internal state representations to determine optimum encodings;

(d) combine said set of internal state representations with each logically adjacent partially encoded set to form a new set of internal state representations; and (e) repeat (a) to (d) until said predetermined number of bits left to be encoded for all of said internal state representations have been encoded.

37. A method of state assignment for a logic circuit, the method comprising:

receiving state transition data for the logic circuit, the state transition data including internal state representations;

determining binary code for said internal state representations one bit at a time by repeatedly dividing the internal state representations into disjoint sets by reference to next states transited to from present states in response to an input to the logic circuit and assigning a one bit code to each of the states of the disjoint sets in dependence upon the divisions;

where the sets of internal state representations become repeatedly smaller after each division, and the divisions of the internal state representations are determined in dependence upon code determined as a result of any previous divisions.

38. The method according to claim 37, wherein the step of determining binary code for said internal state representations comprises:

identifying for a first bit at least one set of internal state representations for next states to which a set of internal state representations for present states transit upon an input to the logic circuit, the or each identified set being one of a pair of disjoint sets dividing said internal state representations into two sets;

assigning a binary code to the first bit for each internal state representation dependent upon which set of the pair of disjoint sets the internal state representations belongs to;

for any subsequent bits, subsequently identifying for each previously identified disjoint set for a previous bit, at least one set of internal state representations for next states to which a set of internal state representations for present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and assigning a binary code to any subsequent bit for each said internal state representation dependent upon which set of the or each pair of disjoint sets the internal state representation belongs.

39. The method according to claim 38, wherein the or each set of internal state representations for next state is identified for a plurality of logically adjacent possible inputs.

40. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 39.

41. The method according to claim 38, wherein the or each set of internal state representations is identified to have, for the first bit, half the number of internal state representations rounded up to the nearest power of two, and for any subsequent bits, half the number of internal state representations in the previously identified disjoint sets rounded up to the nearest power of two.

42. The method according to claim 41, wherein internal state representations are added if necessary to the identified sets of internal state representations to make the sets of a required size.

43. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 42.

44. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 41.

45. The method according to claim 38, wherein at least one of the or each set of internal state representations is identified as a small set of internal state representations for next state for each of a plurality of different inputs to the logic circuit, the method including unioning said small sets to form the at least one set of internal state representation.

46. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 45.

47. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 38.

48. Computer program code for controlling a computer to implement the method of claim 37.

49. A method of constructing a logic circuit comprising the method claim 37, and constructing the logic circuit according to the binary encodings for the internal state representations.

50. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 37.

51. An apparatus for the state assignment of a logic circuit, the apparatus comprising:

receiving means for receiving state transition data for the logic circuit, the state transition data including internal state representations;

determining means for determining binary code for said internal state representations one bit at a time by repeatedly dividing the internal state representations into disjoint sets by reference to next states transited to from present states in response to an input to the logic circuit and for assigning a one bit code to each state of the disjoint sets in dependence upon the divisions;

said determining means being adapted to make the sets of internal state representations become repeatedly smaller after each division, and to determine the divisions of the internal state representations in dependence upon the encoding of any previous divisions.

52. The apparatus according to claim 51, wherein said determining means includes:

identifying means for identifying for a first encoded bit at least one set of internal state representations for next states to which a set of internal state representations for present states transit upon an input to the logic circuit, the or each identified set being one of a pair of disjoint sets dividing said internal state representations into two sets; and assigning means for assigning a binary code to the first bit for each internal state representation dependent upon which set of the pair of disjoint sets the internal state representation belongs to;

wherein said identifying means is adapted, for any subsequent bits and for each previously identified disjoint set, to subsequently identify at least one set of internal state representations for next states to which a set of internal state representations of present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and said assigning means is adapted to assign a binary code to any subsequent bit for each said internal state representation dependent upon which set of the or each pair of disjoint sets the internal state representation belongs.

53. The apparatus according to claim 52, wherein said identifying means is adapted to identify the or each set of internal state representations of next states for a plurality of logically adjacent possible inputs.

54. The apparatus according to claim 52, wherein said identifying means is adapted to identify the or each set of internal state representations to have, for the first bit, half the number of internal state representations rounded up to the nearest power of two, and, for any subsequent bits, half the number of internal state representations in the previously identified disjoint sets rounded up to the nearest power of two.

55. The apparatus according to claim 54, wherein said identifying means is adapted to identify the or each set of internal state representations of next states for a plurality of logically adjacent possible inputs.

56. The apparatus according to claim 52, wherein said determining means includes:

identifying means for identifying, for a first encoded bit, at least one set of internal state representations for next states to which a set of internal state representations for present states transit upon an input to the logic circuit, the or each identified set being one of a pair of disjoint sets dividing said internal state representations into two sets; and assigning means for assigning a binary code to the first bit for each internal state representation dependent upon which set of the pair of disjoint sets the internal state representation belongs to;

wherein said identifying means is adapted, for any subsequent bits and for each previously identified disjoint set, to subsequently identify at least one set of internal state representations for next states to which a set of internal state representations of present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and said assigning means is adapted to assign a binary code to any subsequent bit for each said internal state representation dependent upon which set of the or each pair of disjoint sets the internal state representation belongs.

57. A method of optimising state assignments of a logic circuit, the method comprising:

receiving state data for the logic circuit, the state data including internal state representations each being encoded with a plurality of binary bits;

encoding the plurality of binary encoded bits of each internal state representation as at least one symbolic representation; and determining optimum binary codes for the symbolic representations of the or each set having regard to any binary codes for each representation.

58. The method according to claim 57, wherein the determining step comprises: encoding the internal state representations by determining binary code for said internal state representations one bit at a time until a predetermined number of bits is left to be encoded to provide an encoding of said internal state representations; and exhaustively evaluating possible encodings for the predetermined number of bits left to be encoded having regard to the determined binary code or codes for said internal state representations to determine an optimum state assignment.

59. The method according to claim 56, wherein each determined binary encoding represents a set of said internal state representations, each set of said internal state representations having said predetermined number of bits left to be encoded, and the exhaustive evaluation step comprise:

(a) determining the set of said internal state representations which has the smallest number of internal state representations for next states transited to upon an input which are not in the set and which require encoding of said predetermined number of bits;

(b) defining default encodings for the predetermined number of bits of any said internal state representations for next states not in the set;

(c) exhaustively evaluating the possible encodings for the predetermined number of bits for said set of internal state representations to determine optimum encodings;

(d) combining said set with each logically adjacent partially encoded set to form a new set; and (e) repeating steps (a) to (d) until said predetermined number of bits for all of said internal state representations have been encoded.

60. Computer program code for controlling a computer to implement the method of claim 59.

61. A method of constructing a logic circuit comprising the method claim 59, and constructing the logic circuit according to the binary encodings for the internal state representations.

62. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 59.

63. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 56.

64. The method according to claim 57, wherein said determining step includes, for each encoded bit, determining a cost of outputs of the logic circuit for the encoded bit, and using the determined cost in the determination of optimum binary code for the encoded bit for said internal state representations.

65. The method according to claim 64, wherein said determination of the cost comprises determining a cost of primary outputs of the logic circuit and any previously encoded bits for said internal state representations forming feedback outputs for the logic circuit.

66. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 63.

67. The method according to claim 64, wherein the cost comprises a number of literals for the outputs and the optimum binary code is determined to minimise the number of literals.

68. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 67.

69. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 64.

70. The method according to claim 57, wherein the step of determining binary code for said internal state representations comprises:

determining binary code for said internal state representations one bit at a time by repeatedly dividing the internal state representations into disjoint sets by reference to next states transited to from present states in response to an input to the logic circuit and assigning a binary code to each bit in dependence upon the divisions;

where the sets of internal state representations become repeatedly smaller after each division, and the divisions of the internal state representations are determined in dependence upon the encoding of any previous divisions.

71. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 70.

72. The method according to claim 57, wherein the step of determining binary code for said internal state representations comprises:

identifying for a first bit at least one set of internal state representations for next states to which a set of internal state representations for present state transit upon an input to the logic circuit, the or each identified set being one of a pair of disjoint sets dividing said internal state representations into two sets;

assigning a binary code to the first but for each internal state representation dependent upon which set of the pair of disjoint sets the internal state representations belongs to;

for any subsequent bits, subsequently identifying for each previously identified disjoint set for a previous bit, at least one set of internal state representations for next states to which a set of internal state representations for present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and assigning a binary code to any subsequent bit for each said internal state representation dependent upon which set of the or each pair of disjoint sets the internal state representation belongs.

73. The method according to claim 72, wherein the or each set of internal state representations for next state is identified for a plurality of logically adjacent possible inputs.

74. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 73.

75. The method according to claim 72, wherein the or each set of internal state representations is identified to have, for the first bit, half the number of internal state representations rounded up to the nearest power of two, and for any subsequent bits, half the number of internal state representations in the previously identified disjoint sets rounded up to the nearest power of two.

76. The method according to claim 75, wherein internal state representations are added if necessary to the identified sets of internal state representations to make the sets of a required size.

77. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 76.

78. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 75.

79. The method according to claim 72, wherein at least one of the or each set of internal state representations is identified as a small set of internal state representations for next state for each of a plurality of different inputs to the logic circuit, the method including unioning said small sets to form the at least one set of internal state representations.

80. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 79.

81. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 72.

82. Computer program code for controlling a computer to implement the method of claim 57.

83. A method of constructing a logic circuit comprising the method claim 57, and constructing the logic circuit according to the binary encodings for the internal state representations.

84. A computer system for the state assignment of a logic circuit, the computer system comprising:

a program store for storing processor readable and implementable instructions; and a processor for reading and implementing the instructions in the program store;

wherein the instructions stored in the program store comprise instructions for controlling the processor to carry out the method of claim 57.

85. An apparatus for optimising state assignments of a logic circuit, the apparatus comprising:

receiving means for receiving state data for the logic circuit, the state data including internal state representations each being encoded with a plurality of binary bits;

symbolic means for encoding the plurality of binary encoded bits of each internal state representation as at least one set of symbolic representations; and determining means for determining optimum binary codes for the symbolic representations of the or each set having regard to any binary codes for each representation.

86. The apparatus according to claim 85, wherein said determining means is adapted to determine binary code for said internal state representations one bit at a time until the number of bits left to be encoded to provide an encoding of said internal state representations reaches a predetermined number; and evaluation means for exhaustively evaluating all the possible encodings for the predetermined number of bits having regard to the determined binary code or codes for said internal state representations to determine the optimum state assignment for the logic circuit.

87. The apparatus according to claim 86, wherein said determining means is adapted to, for each encoded bit, determine a cost of outputs of the logic circuit for the encoded bit, and to use the determined cost in the determination of optimum binary code for the encoded bit for said internal state representations.

88. The apparatus according to claim 87, wherein said determining means is adapted to determine the cost of primary outputs of the logic circuit and any previously encoded bits for said internal state representation forming feedback outputs for the logic circuit.

89. The apparatus according to claim 87, wherein the cost comprises the number of literals for the outputs and said determining means is adapted to determine the optimum binary code to minimise the number of literals.

90. The apparatus according to claim 86, wherein each determined binary encoding represents a set of said internal state representations, each set of said internal state representations has said predetermined number of bits left to be encoded, said determining means is adapted to:

(a) determine the set of said internal state representations which has the smallest number of internal state representations for next states transited to upon an input which are not in the set and which require encoding of said predetermined number of bits;

(b) define default encodings for the predetermined number of bits of any said internal state representations for next states not in the set;

(c) exhaustively evaluate the possible encodings for the predetermined number of bits for said set of internal state representations to determine optimum encodings;

(d) combine said set with each logically adjacent partially encoded set to form a new set; and (e) repeat (a) to (d) until said predetermined number of bits for all of said internal state representations have been encoded.

91. The apparatus according to claim 87, wherein said determining means is adapted to repeatedly divide the internal state representations into disjoint sets by reference to next states transited to from present states in response to an input to the logic circuit, and to assign a binary code to each bit in dependence upon the divisions, wherein said determining means is adapted to make the sets of internal state representations repeatedly smaller after each division and to determine the divisions of the internal state representations in dependence upon the encoding of any previous divisions.

92. The apparatus according to claim 85, wherein said determining means includes:
identifying means for identifying for a first encoded bit at least one set of internal state representations for next states to which a set of internal state representations for present states transit upon an input to the logic circuit, the or each identified set being one of a pair of disjoint sets dividing said internal state representations into two sets; and
assigning means for assigning a binary code to the first bit for each internal state representation dependent upon which set of the pair of disjoint sets the internal state representation belongs to;
wherein said identifying means is adapted for any subsequent bits and for each previously identified disjoint set to subsequently identify at least one set of internal state representations for next states to which a set of internal state representations of present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and
said assigning means is adapted to assign a binary code to any subsequent bit for each said internal state representation dependent upon which set of the or each pair of disjoint sets the internal state representation belongs.

93. The apparatus according to claim 92, wherein said identifying means is adapted to identify the or each set of internal state representations of next states for a plurality of logically adjacent possible inputs.

94. The apparatus according to claim 92, wherein said identifying means is adapted to identify the or each set of internal state representations to have, for the first bit, half the number of internal state representations rounded up to the nearest power of two, and, for any subsequent bits, half the number of internal state representations in the previously identified disjoint sets rounded up to the nearest power of two.

95. The apparatus according to claim 94, including means for adding internal state representations if necessary to the identified sets of internal state representations to make the sets of the required size.

96. The apparatus according to claim 92, wherein said identifying means is adapted to identify at least one of the or each set of internal state representations as a small set of internal state representations for next states for each of a plurality of different inputs to the logic circuit, the apparatus including unioning means for unioning said small sets to form the at least one set of internal state representation.

97. A carrier medium carrying computer readable code for controlling a computer to execute a method of state assignment of a logic circuit, the method comprising:
receiving state transition data for the logic circuit, the state transition data including internal state representations;
encoding the internal state representations by determining binary code comprising a plurality of bits for said internal state representations one bit at a time until a predetermined number of bits is left to be encoded to provide an encoding of said internal state representations; and
exhaustively evaluating possible encodings for the predetermined number of bits left to be encoded having regard to a least one determined binary code for said internal state representations to determine an optimum state assignment for the logic circuit.

98. The carrier medium according to claim 97, wherein the computer readable code is adapted to control the computer to carry out the determining step by, for each encoded bit, determining a cost of outputs of the logic circuit having the internal state representations encoded with the encoded bit, and using the determined cost in a determination of optimum binary code for the encoded bit of said internal state representations.

99. The carrier medium according to claim 98, wherein the computer readable code is adapted to control the computer to perform the determination of the cost by determining a cost of primary outputs of the logic circuit and any previously encoded bits for said internal state representation forming feedback outputs for the logic circuit.

100. The carrier medium according to claim 98, wherein the cost comprises a number of literals and the computer program code is adapted to control the computer to determine the optimum binary code to minimise the number of literals.

101. The carrier medium according to claim 97, wherein the computer readable code is arranged to control the computer to perform the step of determining binary code for said internal state representations by:
determining binary code for said internal state representations one bit at a time by repeatedly dividing the internal state representations into disjoint sets by reference to next states transited to from present states in response to an input to the logic circuit and assigning a binary code to each bit in dependence upon the divisions;
where the sets of internal state representations become repeatedly smaller after each division, and the divisions of the internal state representations are determined in dependence upon the encoding of any previous divisions.

102. The carrier medium according to claim 97, wherein the computer readable code is adapted to control the computer to carry out the step of determining binary code for said internal state representations by:
identifying for a first bit at least one set of internal state representations for next states to which a set of internal state representations for present state transit upon an input to the logic circuit, each identified set being one of a pair of disjoint sets dividing said internal state representations into two sets;
assigning a binary code to the first bit for each internal state representation dependent upon which set of the pair of disjoint sets the internal state representations belongs to;
for any subsequent bits, subsequently identifying for each previously identified disjoint set for a previous bit, at least one set of internal state representations for next states to which a se of internal state representations for present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and assigning a binary code to any subsequent bit for each said internal state representation dependent upon which set of the or each pair of disjoint sets the internal state representation belongs.

103. The carrier medium according to claim 102, wherein the computer readable code is adapted to control the computer to identify the or each set of internal state representations for next state for a plurality of logically adjacent possible inputs.

104. The carrier medium according to claim 102, wherein the computer readable code is arranged to control the computer to identify the or each set of internal state representations to have, for the first bit, half the number of internal state representations rounded up to the nearest power of 2, and for any subsequent bits, half the number of internal state representations in the previously identified disjoint sets rounded up to the nearest power of 2.

105. The carrier medium according to claim 104, wherein said computer readable code is adapted to control the computer to add internal state representations if necessary to the identified sets of internal state representations to make the sets of a required size.

106. The carrier medium according to claim 102, wherein the computer readable code is arranged to control the computer to identify at least one of the or each sets of internal state representations as a small set of internal state representations for next states for each of a plurality of different inputs to the logic circuit, and to form the at least one set of internal state representations by unioning said small sets.

107. The carrier medium according to claim 97, wherein each determined binary encoding represents a set of said internal state representations, each set of said internal state representations having said predetermined number of bits left to be encoded, and said computer readable code is arranged to control the computer to carry out the exhaustive evaluation step by:

(a) determining the set of said internal state representations which has a smallest number of internal state representations for next states transited to upon an input which are not in the set and which require encoding of said predetermined number of bits left to be encoded;

(b) defining default encodings for the predetermined number of bits left to be encoded for any said internal state representations for next states not in the set of internal state representations;

(c) exhaustively evaluating the possible encodings for the predetermined number of bits left to be encoded for said set of internal state representations to determine optimum encodings;

(d) combining said set of internal state representations with each logically adjacent partially encoded set to form a new set of internal state representations; and (e) repeating steps (a) to (d) until said predetermined number of bits left to be encoded for all of said internal state representations have been encoded.

108. A carrier medium carrying computer readable code for controlling a computer to carry out a method of state assignment for a logic circuit, the method comprising the steps of:

receiving state transition data for the logic circuit, the state transition data including internal state representations; and determining binary code for said internal state representations one bit at a time by repeatedly dividing the internal state representations into disjoint sets by reference to next states transited to from present states in response to an input to the logic circuit and assigning a one bit code to each of the states of the disjoint sets in dependence upon the divisions;

wherein the sets of internal state representations become repeated smaller after each division, and the divisions of the internal state representations are determined in dependence upon code determined as a result of any previous divisions.

109. The carrier medium according to claim 108, wherein the computer readable code is arranged to control the computer to carry out the step of determining binary code for said internal state representations by:

identifying for a first bit at least one set of internal state representations for next states to which a set of internal state representations for present states transit upon an input to the logic circuit, the or each identified set being one of a pair of disjoint sets dividing said internal state representations into two sets;

assigning a binary code to the first bit for each internal state representation dependent upon which set of the pair of disjoint sets the internal state representations belongs to;

for any subsequent bits, subsequently identifying for each previously identified disjoint set for a previous bit, at least one set of internal state representations for next states to which a set of internal state representations for present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and assigning a binary code to any subsequent bit for each said internal state representation dependent upon which set of the or each pair of disjoint sets the internal state representation belongs.

110. The carrier medium according to claim 109, wherein the computer readable code is arranged to control the computer to identify the or each set of internal state representations for next state for a plurality of logically adjacent possible inputs.

111. The carrier medium according to claim 109, wherein the computer readable code is arranged to control the computer to identify the or each set of internal state representations to have, for the first bit, half the number of internal state representations rounded up to the nearest power of 2, and for any subsequent bits, half the number of internal state representations in the previously identified disjoint sets rounded up to the nearest power of 2.

112. The carrier medium according to claim 111, wherein the computer readable code is arranged to control the computer to add internal state representations if necessary to the identified sets of internal state representations to make the sets of a required size.

113. The carrier medium according to claim 109, wherein the computer readable code is arranged to control the computer to identify at least one of the or each set of internal state representations as a small set of internal state representations for next state for each of a plurality of different inputs to the logic circuit, and to union said small sets to form the at least one set of internal state representations.

114. A carrier medium carrying computer readable code for controlling a computer to carry out a method of optimizing state assignments of a logic circuit, the method comprising:

receiving state data for the logic circuit, the state data including internal state representations each being encoded with a plurality of binary bits;

encoding the plurality of binary encoded bits of each internal state presentation as at least one symbolic representation; and determining optimum binary codes for the symbolic representations of the or each set having regard to any binary codes for each representation.

115. The carrier medium according to claim 114, wherein the computer readable code is arranged to control the computer to carry out the determining step by:

encoding the internal state representations by determining binary code for said internal state representations one bit at a time until a predetermined number of bits is left to be encoded to provide an encoding of said internal state representations; and exhaustively evaluating possible encodings for the predetermined number of bits left to be encoded having regard to the determined binary code or codes for said internal state representations to determine an optimum state assignment.

116. The carrier medium according to claim 115, wherein each determined binary encoding represents a set of said internal state representations, each set of said internal state representations having said predetermined number of bits left to be encoded, and the computer readable code is arranged to control the computer to carry out the exhaustive evaluation step by:

(a) determining the set of said internal state representations which has the smallest number of internal state representations for next states transited to upon an input which are not in the set and which require encoding of said predetermined number of bits;

(b) defining default encodings for the predetermined number of bits of any said internal state representations for next states not in the set;

(c) exhaustively evaluating the possible encodings for the predetermined number of bits for said set of internal state representations to determine optimum encodings;

(d) combining said set with each logically adjacent partially encoded set to form a new set; and (e) repeating steps (a) to (d) until said predetermined number of bits for all of said internal state representations have been encoded.

117. The carrier medium according to claim 114, wherein the computer readable code is arranged to control the computer to carry out the determining step by, for each encoded bit, determining the cost of outputs of the logic circuit for the encoded bit, and using the determined cost in the determination of optimum binary code for the encoded bit for said internal state representations.

118. The carrier medium according to claim 117, wherein the computer readable code is arranged to control the computer to carry out the determination of cost by determining a cost of primary outputs of the logic circuit at any previously encoded bits for said internal state representations forming feedback outputs for the logic circuit.

119. The carrier medium according to claim 117, wherein the cost comprises a number of literals for the outputs and the optimum binary code is determined to minimise the number of literals.

120. The carrier medium according to claim 114, wherein the computer readable code is arranged to control the computer to carry out the step of determining binary code for the internal state representations by:

determining binary code for said internal state representations one bit at a time by repeatedly dividing the internal state representations into disjoint sets by reference to next states transited to from present states in response to an input to the logic circuit and assigning a binary code to each bit in dependence upon the divisions;

where the sets of internal state representations become repeatedly smaller after each division, and the divisions of the internal state representations are determined in dependence upon the encoding of any previous divisions.

121. The carrier medium according to claim 114, wherein the computer readable code is arranged to control the computer to carry out the step of determining binary code for said internal state representations by:

identifying for a first bit at least one set of internal state representations for next states to which a set of internal state representations for present state transit upon an input to the logic circuit, the or each identified set being one of a pair of disjoint sets dividing said internal state representations into two sets;

assigning a binary code to the first but for each internal state representation dependent upon which set of the pair of disjoint sets the internal state representations belongs to;

for any subsequent bits, subsequently identifying for each previously identified disjoint set for a previous bit, at least one set of internal state representations for next states to which a set of internal state representations for present states contained within the previously identified disjoint set of internal state representations transit upon an input to the logic circuit and using the assigned binary code of a previous bit as an input, the or each subsequently identified set being one of a pair of disjoint sets dividing the previously identified disjoint set of internal state representations into two sets; and assigning a binary code to any subsequent bit for each said internal state representation dependent upon which set of the or each pair of disjoint sets the internal state representation belongs.

122. The carrier medium according to claim 121, wherein the computer readable code is arranged to control the computer to identify the or each set of internal state representations for next state for a plurality of logically adjacent possible inputs.

123. The carrier medium according to claim 121, wherein the computer readable code is arranged to control the computer to identify the or each set of internal state representations to have, for the first bit, half the number of internal state representations rounded up to the nearest power of 2, and for any subsequent bits, half the number of internal state representations in the previously identified disjoint sets rounded up to the nearest power of 2.

124. The carrier medium according to claim 123, wherein the computer readable code is arranged to control the computer to add internal state representations if necessary to the identified sets of internal state representations to make the sets of a required size.

125. The carrier medium according to claim 121, wherein the computer readable code is arranged to control the computer to identify at least one of the or each set of internal state representations as a small set of internal state representations for next state for each of a plurality of different inputs to the logic circuit, and to union said small sets to form the at least one set of internal state representations.

* * * * *